(12) United States Patent
Baker et al.

(10) Patent No.: US 6,232,639 B1
(45) Date of Patent: May 15, 2001

(54) METHOD AND STRUCTURE TO REDUCE LATCH-UP USING EDGE IMPLANTS

(75) Inventors: Faye D. Baker, Burlington; Jeffrey S. Brown, Jeffersonville; Robert J. Gauthier, Jr., Burlington; Steven J. Holmes, Milton; Robert K. Leidy, Burlington; Edward J. Nowak, Essex; Steven H. Voldman, South Burlington, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/107,900

(22) Filed: Jun. 30, 1998

Related U.S. Application Data

(62) Division of application No. 08/852,466, filed on May 7, 1997, now Pat. No. 5,861,330.

(51) Int. Cl.[7] .................................................. H01L 29/76
(52) U.S. Cl. .............................................. 257/372; 257/519
(58) Field of Search .................................. 257/372, 371, 257/519

(56) References Cited

U.S. PATENT DOCUMENTS

| | | | |
|---|---|---|---|
| 4,277,291 | * 7/1981 | Cerofolini et al. | 148/1.5 |
| 4,282,648 | 8/1981 | Yu et al. | 438/227 |
| 4,313,768 | * 2/1982 | Sanders et at. | 148/1.5 |
| 4,405,708 | 9/1983 | van Pelt et al. | 430/281 |
| 4,412,375 | 11/1983 | Matthews | 438/451 |
| 4,568,631 | 2/1986 | Badami et al. | 430/315 |
| 4,683,488 | * 7/1987 | Lee et al. | 257/372 |
| 4,687,730 | 8/1987 | Eron | 430/324 |
| 4,707,218 | 11/1987 | Giammarco et at. | 156/643 |
| 4,728,619 | 3/1988 | Pfiester et al. | 438/451 |
| 4,799,990 | 1/1989 | Kerbaugh et al. | 156/636 |
| 5,330,879 | 7/1994 | Dennison | 430/313 |
| 5,338,626 | 8/1994 | Garofalo et al. | 430/312 |
| 5,422,301 | 6/1995 | Otsuki | 438/227 |
| 5,861,330 | * 1/1999 | Baker et al. | 438/232 |

* cited by examiner

*Primary Examiner*—Mark V. Prenty
(74) *Attorney, Agent, or Firm*—Schmeiser, Olsen & Watts; Eugene Shkurko

(57) ABSTRACT

The preferred embodiment of the present invention overcomes the limitations of the prior art and provides a device and method to increase the latch-up immunity of CMOS devices by forming implants at the well edges. The preferred method uses hybrid resist to form these implants at the edges of the N-wells and/or P-wells. The implants reduce the lifetime of minority carriers in the parasitic transistor, and hence reduce the gain of the parasitic transistor. This reduces the propensity of the CMOS device to latch-up. The preferred embodiment method allows these implants to be formed without requiring additional masking steps over prior art methods. Furthermore, the preferred method for forming the implants results in implants that are self aligned to the edges of the wells.

8 Claims, 27 Drawing Sheets

US 6,232,639 B1

METHOD AND STRUCTURE TO REDUCE LATCH-UP USING EDGE IMPLANTS

RELATED APPLICATIONS

This application is a divisional of the earlier patent application by Baker, et al. entitled "Method and Structure to Reduce Latch-up Using Edge Implants", Ser. No. 08/852,466, filed May 7, 1997, and now U.S. Pat. No. 5,861,330 that is incorporated herein by reference.

This application is related to the following co-pending U.S. patent applications, Ser. No. 08/715,288, for "Low 'K' Factor Hybrid Photoresist," and Ser. No. 08/715,287, for "Frequency Doubling Photoresist," both filed Sep. 16, 1996.

BACKGROUND OF THE INVENTION

1. TECHNICAL FIELD

This invention generally relates to semiconductor devices, and more specifically relates to methods and structures to reduce latch-up.

2. BACKGROUND ART

As integrated semiconductor devices continue to grow in complexity, there is a constant need to increase the density of the semiconductor devices. This increase in density creates several problems that can cause devices failures if not addressed. One such problem is the propensity for semiconductor devices, particularly CMOS devices, to "latch-up." Latch-up is a well known problem caused by unwanted transistor action between elements of the integrated circuit. This unwanted transistor action can be triggered by a wide variety of events, and can cause the semiconductor device to fail.

Latch-up is generally caused by the close proximity of n-channel and p-channel devices in modem CMOS devices. For example, a typical CMOS device fabricated on a p-type substrate would contain a p-channel device fabricated in a n-well and an n-channel device fabricated in a p-well, with only a short distance between the wells. This structure inherently forms a parasitic lateral bipolar structure (NPN) and parasitic vertical bipolar structure (PNP). Under certain biasing conditions the PNP structure can supply base current to the NPN structure (or vice versa), causing a large current to flow from the PNPN anode to cathode. When a PNPN devices triggers, the PNPN undergoes a transition from a low current\high voltage state to a low voltage/high current state. In some cases, the low voltage/high current state can lead to thermal runaway and destruction of the elements involved in the formation of the PNPN parasitic element.

For example, turning to FIG. 30, a CMOS device portion 800 is shown. The exemplary CMOS portion 800 is formed in p+ substrate 802 having a p-epitaxial layer 804. The CMOS portion 800 includes an n-channel device (of which only the first N++ diffusion 806 is shown) formed in a P-well 808 and a p-channel device (of which only the first P++ diffusion 810 is shown) formed in an N-well 812. The two devices are separated by a shallow trench isolation (STI) 814.

One parasitic lateral bipolar structure (NPN) is formed by the N++ diffusion 806, the P-well 808/P epitaxial layer 804, and the N-well 812 respectively. When latch-up occurs, the structure acts as a lateral bipolar NPN transistor with the N++ diffusion 806 acting as its emitter, P-well 808 and P epitaxial layer 804 acting as its base, and N-well 812 acting as the collector. N++ diffusion 806 injects electrons into P-well 808. The injected electrons are collected by N-well 812.

Likewise a parasitic vertical bipolar structure (PNP) is formed by the P++ diffusion 810, the N-well 812 and the P epitaxial layer 804, with the P++ diffusion 810 acting as its emitter, N-well 812 acting as its base, and P epitaxial layer 804 acting as its collector. Holes injected from P++ diffusion 810 into N-well 812 are collected by P epitaxial layer 804. The flow of holes from N-well 812 to P epitaxial layer 804 produces a corresponding flow of electrons from P epitaxial layer 804 to N-well 812, thereby enhancing the transfer effect of the NPN lateral bipolar structure.

This positive feedback action can cause the NPNP structure to latch-up. Of course, this is just one example of latch-up and where it can occur on a CMOS device, and latch-up can occur at other NPNP or PNPN paths throughout a typical CMOS device.

The propensity for CMOS devices to latch-up has been addressed in several ways. One way involves reducing the "gain" of the transistor type action. The gain is a function of the minority carrier lifetime in the base region. Reducing the gain reduces the propensity of the CMOS device to latch-up by increasing the voltage (known as the "trigger voltage") that must be applied to have the parasitic PNPN undergo a negative resistance state, which can lead to CMOS latch-up.

The gain of a parasitic transistor in a CMOS device is a function of many parameters, such as well profile design and P+/N+ spacings. In particular, the lateral and vertical profile can influence the parasitic bipolar gain of the lateral and vertical parasitic transistors respectively. Thus, the placement and control of the well-profile edge can strongly influence the latch-up characteristics of an advanced CMOS process. Today, the P-well-to-N-well spacing control is determined in part by overlay variations. As the devices are scaled and the P+ to N+ space decreases, the ability to limit the parasitic gain by controlling the well profile using prior art fabrication technologies will be increasing problematic.

Another method in dealing with latch-up is to raise the latch-up holding voltage. The latch-up holding voltage is the lowest stable voltage that can support a large current after latch-up is triggered. By increasing the latch-up holding voltage, the latch-up immunity is increased and the likelihood of the circuit being damaged is decreased. The optimal situation is to have a holding voltage greater than the burn-in voltage, typically 1.5 volts above the nominal supply voltage (Vdd).

Shallow trench isolation (STI) has been used between the n-channel and p-channel devices to minimize the likelihood of latch-up. However, when CMOS technologies are scaled to smaller dimensions, all geometric parameters including the STI dimensions are reduced. As the STI depth and/or width is reduced, latch-up immunity is decreased as a result of a higher transistor current gain and lower latch-up holding voltages. If the latch-up holding voltage is reduced too much, i.e., to less than the burn-in voltage, immunity to latch-up is compromised.

The prior art methods are thus unable to provide sufficient latch-up immunity in CMOS devices as the size of the devices, particular the isolation regions between the devices is decreased. Thus, there is a need for improved methods for increasing the latch-up immunity of CMOS devices that will allow for further device scaling and increased device density.

DISCLOSURE OF INVENTION

The present invention overcomes the limitations of the prior art and provides a device and method to increase the latch-up immunity of CMOS devices by forming implants at the well edges. The preferred embodiment method to increase the latch-up immunity of CMOS devices uses hybrid resist to form implants at the edges of the N-wells and/or P-wells. The implants reduce the lifetime of minority carriers in the parasitic transistor, and hence reduce the gain of the parasitic transistor. This reduces the propensity of the CMOS device to latch-up. The preferred embodiment method allows these implants to be formed without requiring additional masking steps over prior art methods. Furthermore, the preferred method for forming the implants results in implants that are self aligned to the edges of the wells.

The foregoing and other advantages and features of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements.

BEST MODE FOR CARRYING OUT THE INVENTION

Figure 1:
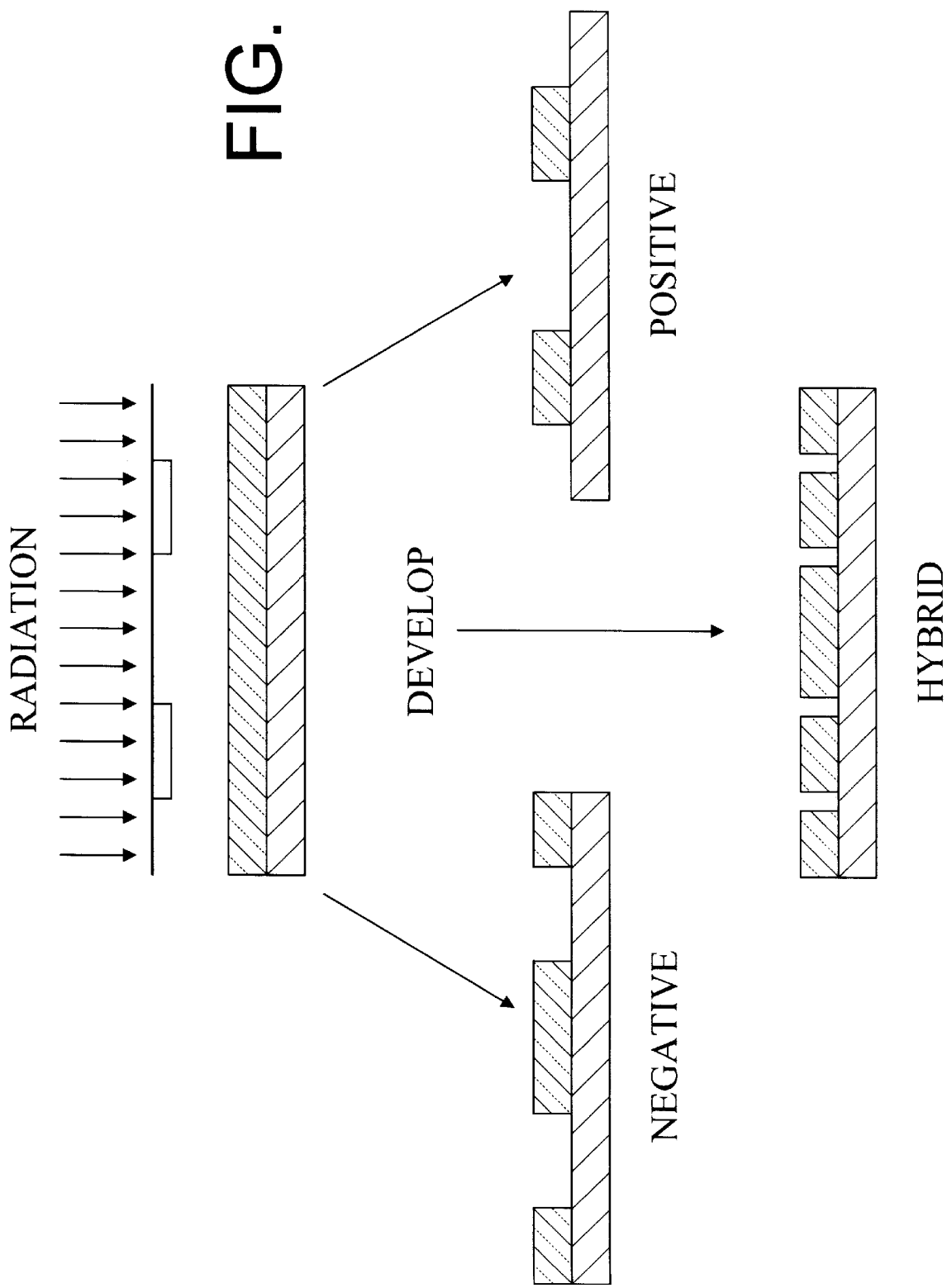
FIG. 1 is a schematic diagram showing the use of the hybrid resist.

The preferred embodiment of the present invention overcomes the limitations of the prior art and provides a device and method to increase the latch-up immunity of CMOS devices using hybrid photoresist to form an implant at the edges of the N-wells and/or P-wells. The implants reduce the lifetime of minority carriers in the parasitic transistor, and hence reduce the gain of the parasitic transistor. This reduction in gain reduces the propensity of the CMOS device to latch-up. By using hybrid photoresist, the implants are self aligned to the edges of the wells.

A description of hybrid photoresist will now be given, followed by a description of the preferred embodiments.

Hybrid Photoresist

The preferred embodiment uses photoresist material having, simultaneously, both a positive tone and a negative tone response to exposure. This combination of materials can provide a new type of resist, which we call a hybrid resist.

As a hybrid resist is exposed with actinic radiation, areas exposed with high intensity radiation form a negative tone line pattern. Areas which are unexposed remain insoluble in developer, thus forming a positive tone line pattern. Areas which are exposed with intermediate amounts of intensity, such as the edges of the aerial image where diffraction effects have reduced the intensity, form a space in the resist film during develop. This resist response is an expression of the unique dissolution rate properties of this resist, in which unexposed resist does not develop, partially exposed resist develops at a high rate, and highly exposed resist does not develop.

The unique dissolution rate response of the hybrid photoresist allows a single aerial image to be printed as a space/line/space combination rather than as a single line or space, as with conventional resist. This 'frequency doubling' capability of this resist allows conventional expose systems to be extended to higher pattern densities. It is an advantage of one example of hybrid resist that lines and spaces of 0.2 $\mu$m and less can be printed with current deep ultra violet (DUV) lithography tools that are designed for operation at 0.35 $\mu$m resolution.

It is a further advantage of this type of hybrid resist that the space width is generally unchanging as the exposure dose and the reticle image size are changed. This allows very precise image control for the space width within each chip, across each wafer, and from one batch of product wafers to the next.

Still another advantage the hybrid resist is the relaxation of the minimum reticle feature size due to the frequency doubling capability of hybrid resist. For example, to print a 0.2 $\mu$m feature with conventional resist generally requires a 0.2 $\mu$m reticle image size. With hybrid resist, a 0.2 $\mu$m space can be formed with a single edge of a reticle feature; for example, a 0.5 $\mu$m reticle opening could produce two 0.2 $\mu$m spaces and a 0.2 $\mu$m line. In this way, one could accomplish 'reduction' x-ray or E-beam lithography; the reticle image pitch could be approximately 2× the printed pitch on the substrate. This also has the additional advantage of allowing a relaxation of the image size requirements of optical reticles, reducing cost and improving yield of the reticle. It is an advantage of hybrid resist that lines and spaces of 0.2 $\mu$m and less may be achieved without altering the present tools.

It is a further advantage that the space width is generally unchanging as the exposure dose and reticle sizes change, thereby allowing greater process latitude for control of space width. Through the use of the hybrid resist of the present invention, errors in the image dimension on the reticle are not reproduced in the space width printed on the substrate. As a result, the across-chip space width variation is minimized. This is valuable for optical, X-ray and e-beam exposure methods. It is especially useful in lithographic techniques that require a 1× reticle, i.e., a reticle that normally has a one-to-one relationship with the image printed on the substrate, because variations in the image size on the reticle are normally reproduced on the substrate.

Figure 25:
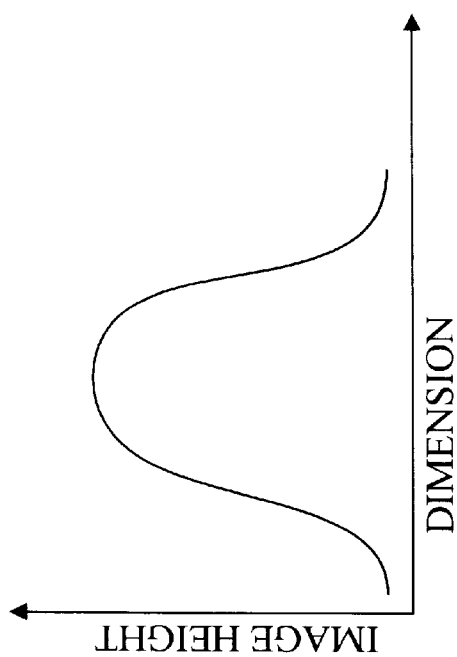
FIG. 25 is a graph illustrating the line pattern for positive resist printed with a reticle line pattern.
Figure 24:
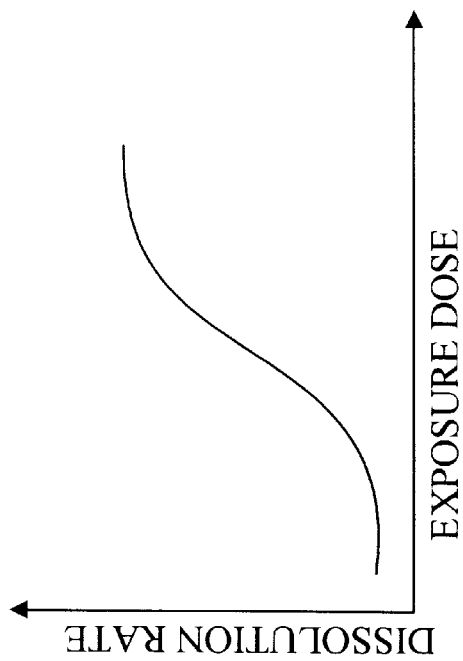
FIG. 24 is a graph is illustrating how positive resist undergoes an increase in solubility as the exposure dose is increased.

Accordingly, the preferred embodiment hybrid resist provides a photoresist material having, simultaneously, both a positive tone and a negative tone response to exposure. The positive tone response dominates at the lower exposure dose while the negative response predominates at the higher exposure dosages. Exposure of this resist creates a space/line/space combination, whereas either of the conventional resists would produce only a single feature. Turning to FIG. 24, a graph is illustrated showing how positive resist undergoes an increase in solubility as the exposure dose is increased. Turning to FIG. 25, the line pattern for positive resist printed with a reticle line pattern is illustrated.

Figure 27:
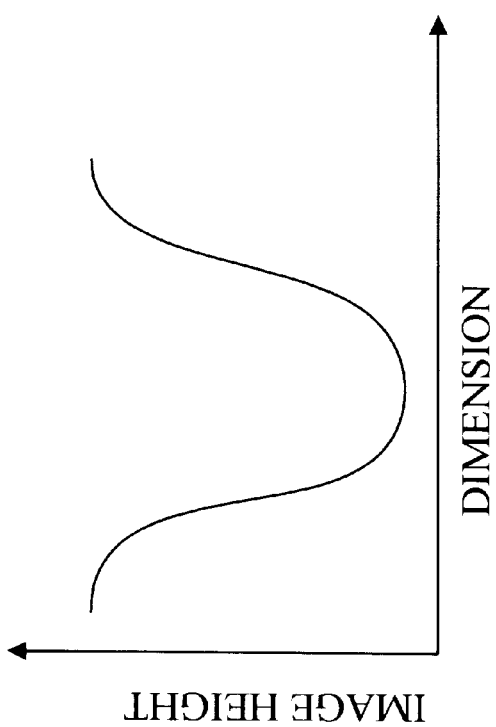
FIG. 27 is a graph illustrating the line pattern for negative resist printed with a reticle line pattern.
Figure 26:
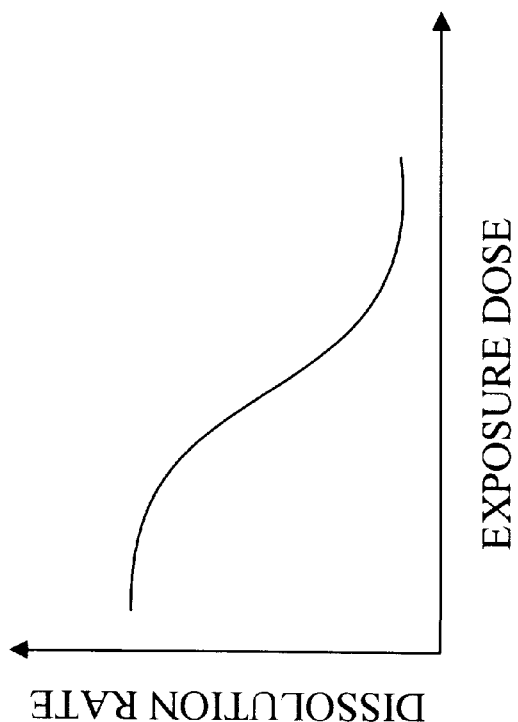
FIG. 26 is a graph illustrating how in negative resist systems exposed areas undergo a reduction in solubility as the exposure dose is increased.

On the other hand, in the negative resist system exposed areas undergo a reduction in solubility as the exposure dose is increased, as illustrated in FIG. 26. Turning to FIG. 27, the line pattern for negative resist printed with a reticle line pattern is illustrated.

Figure 29:
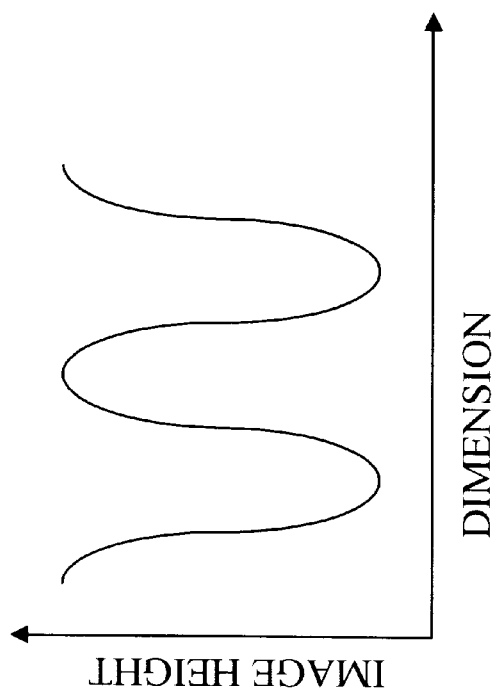
FIG. 29 is a graph illustrating the space/line/space pattern formed onto a substrate using hybrid resist.
Figure 28:
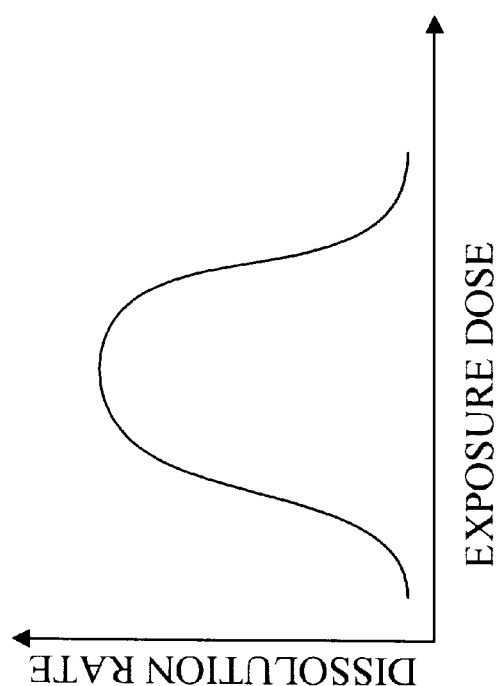
FIG. 28 is a graph of the resist solubility as a function of exposure dose for hybrid resist.
Figure 30:
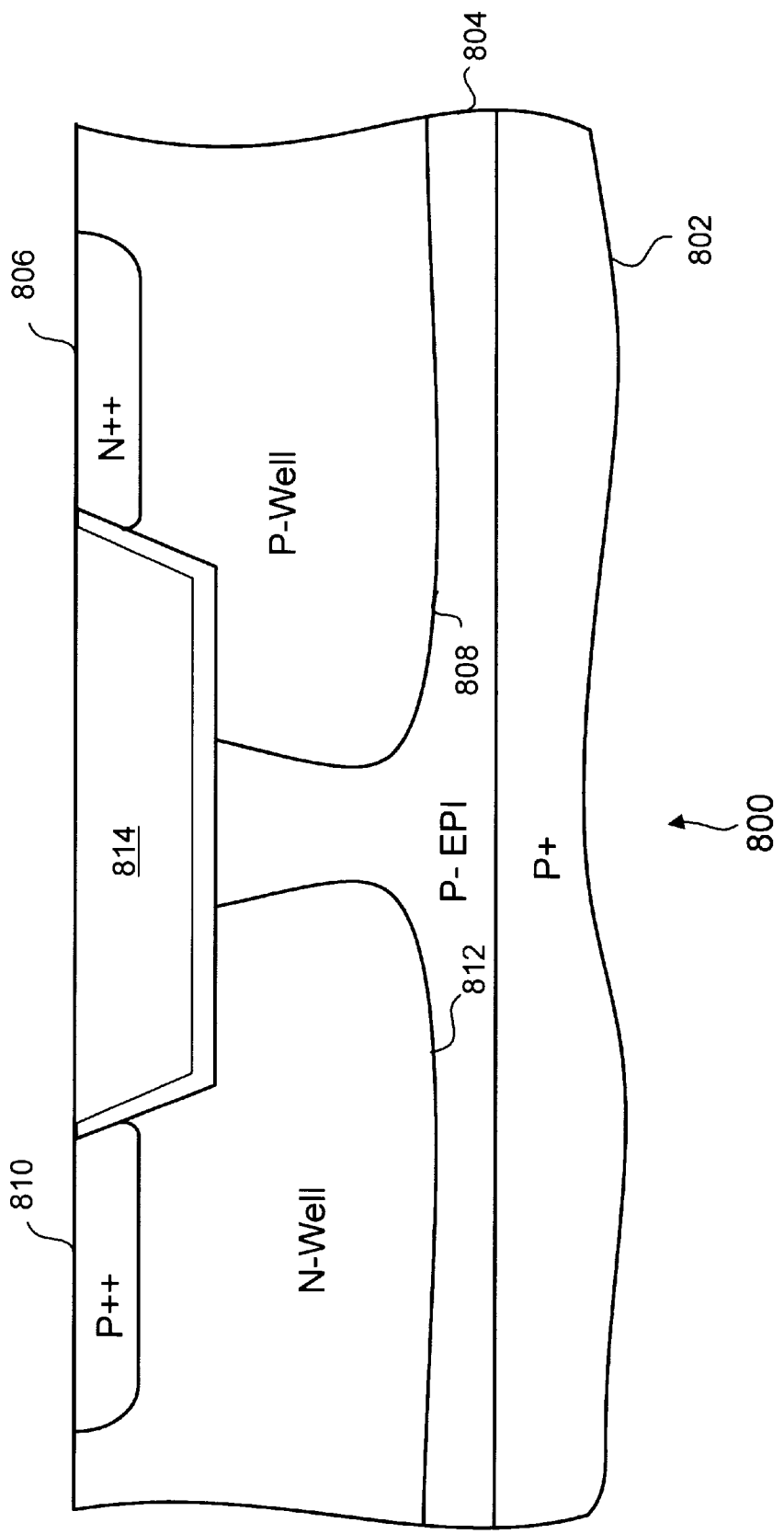
FIG. 30 is a cross-sectional side view of a prior art CMOS wafer portion.

For the hybrid resist of the present invention, the positive tone response causes an increase in solubility in the areas where diffraction effects have reduced the expose intensity, such as the areas near the edge of the reticle image. As the exposure dose is increased, the negative tone response predominates, causing a reduction in solubility in the more highly exposed areas. Turning to FIG. 28, the graph of the resist solubility as a function of exposure dose for hybrid resist is illustrated. Printing a reticle line pattern onto a substrate results in the space/line/space pattern illustrated in FIG. 29.

In this manner, the aerial image is "frequency doubled" to produce twice the number of features than would otherwise be attainable with the standard resist. FIG. 1 illustrates these salient differences between a positive resist, a negative resist, and a hybrid resist.

The frequency doubling hybrid resist is typically formulated using components of existing positive and negative tone resists. This includes, for example, poly (hydroxystyrene) resins which are partially modified with acid-sensitive solubility dissolution inhibiting functionalities, a cross-linker, a photo-acid generator, and, optionally, a base additive and a photosensitizer.

The resist formulations may be varied to obtain a fast positive tone reaction and a slow negative tone reaction for optimal results. Additionally, the positive tone component can be chosen such that it is relatively insensitive to post expose bake temperatures, while the negative tone portion is chosen to be more highly sensitive to post expose bake temperatures. In this way, the relative sensitivity of the positive and negative responses can be altered with bake temperatures to provide the desired imaging results.

Figure 4:
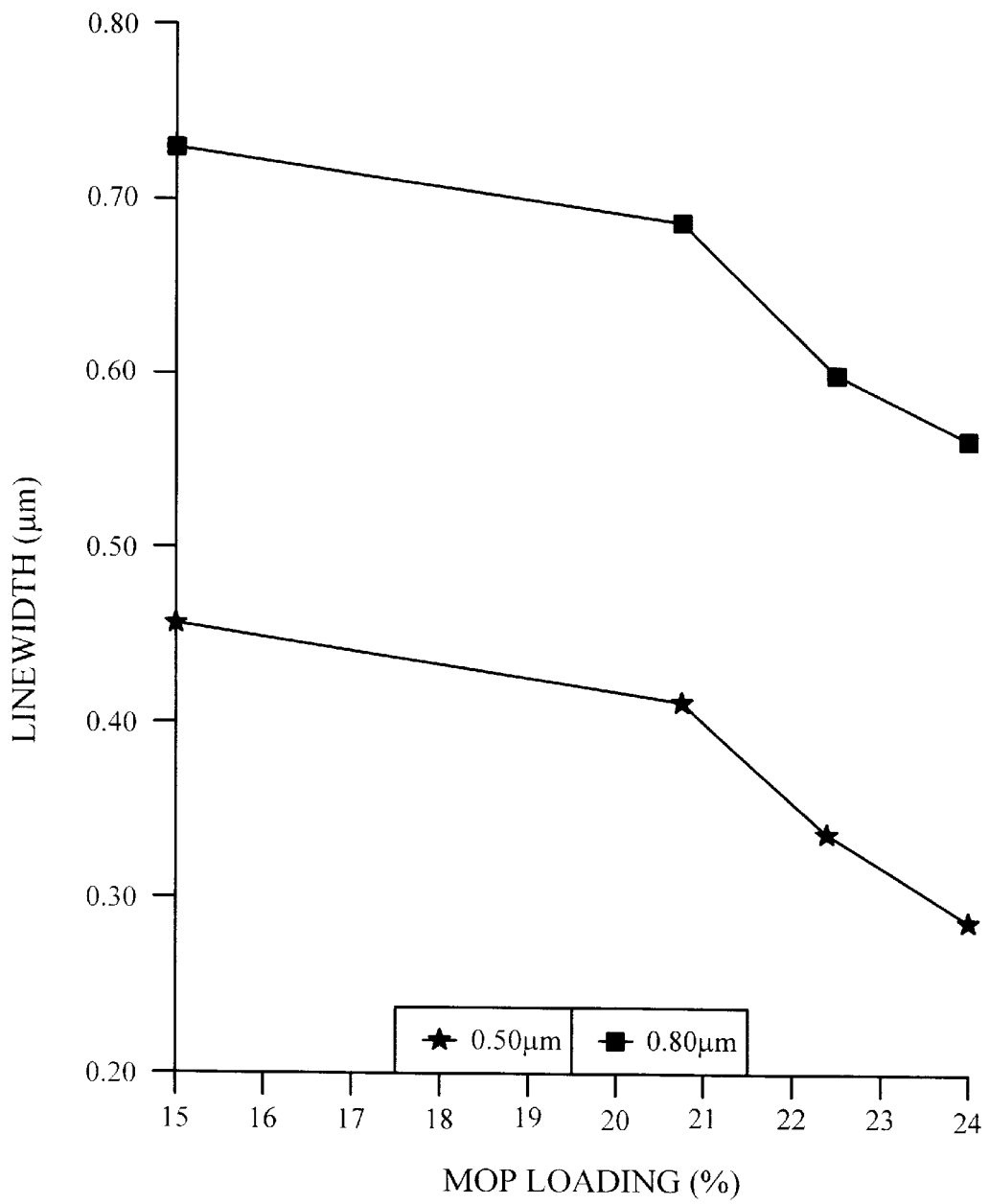
FIG. 4 is a graph showing the linewidth in $\mu$m plotted against the amount of positive tone solubility inhibitor (MOP) incorporated in a hybrid resist of the present invention.
Figure 9:
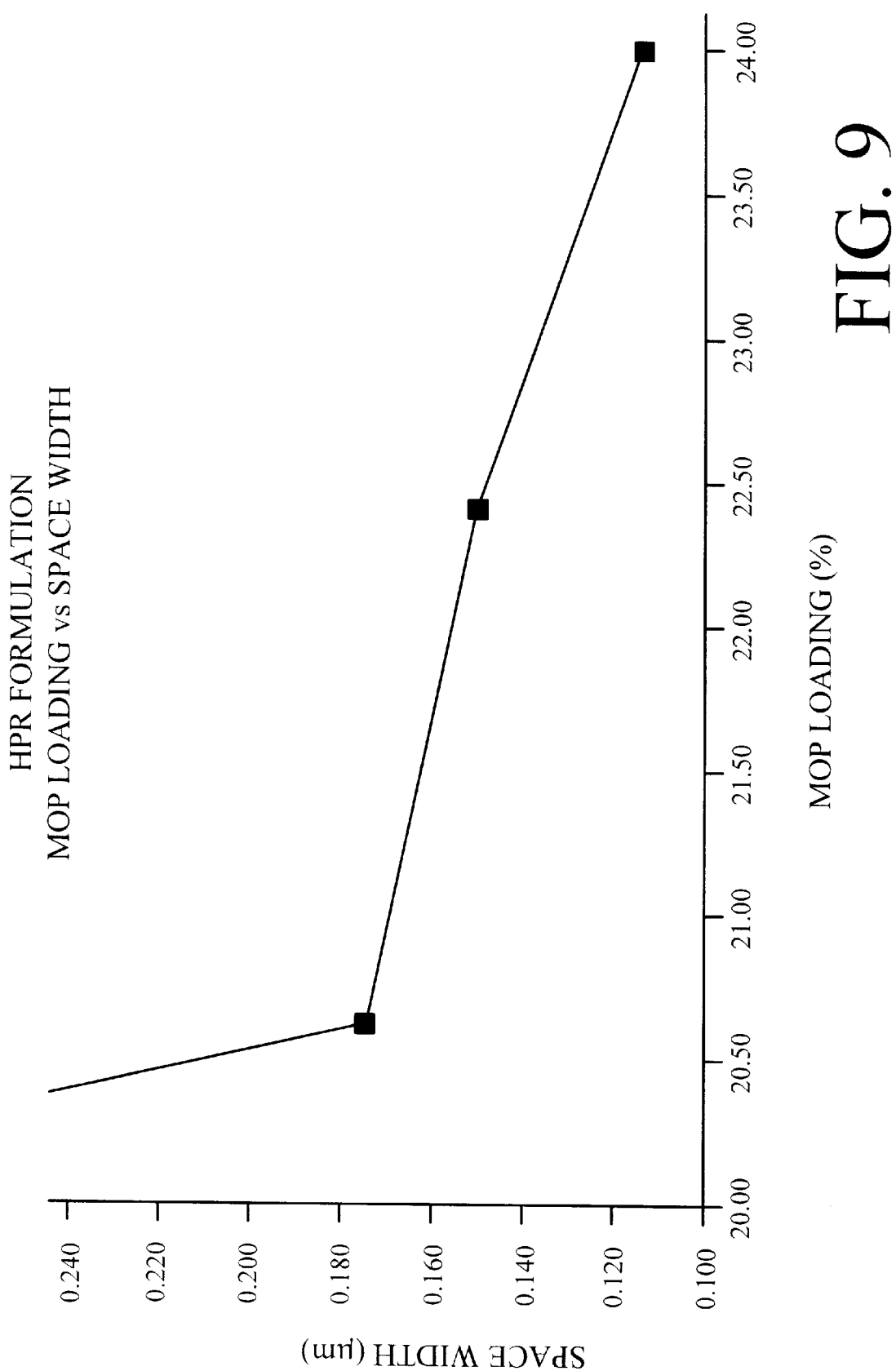
FIG. 9 is a graph showing the variation in space width in $\mu$m as a function of MOP loading using one formulation of hybrid resist of the present invention.

In addition, the resist formulations may be altered to provide space widths of different dimensions. For example, as the amount of solubility inhibitor on the poly (hydroxystyrene) resin is increased, the printed space width becomes smaller (FIG. 9). This approach may also be used to alter the isofocal print bias of the negative tone line; at higher positive tone solubility inhibitor concentrations, the isofocal print bias of the negative tone line increases (FIG. 4). This is desirable in some applications for reducing the size of the printed negative tone line, optimizing the frequency doubling characteristics of the resist.

The relative responses of the positive and negative tone functions of the hybrid resist can also be altered by modifying the exposure conditions. For example, the negative tone line of the hybrid resist does vary with exposure dose and reticle dimension, similar to the behavior of a conventional resist. Thus, as exposure dose is increased, for example, the negative tone line increases in width, and the spaces remain the same size, but the spaces are shifted to a new position on the substrate, since they lie adjacent to the negative line. Similarly, the positive tone lines alter in size as the exposure dose or reticle dimension are altered.

As another example, two reticles could be used to print two separate patterns in the resist. One reticle could be exposed with a high dose, causing the hybrid functions to be expressed in the resist. Another reticle could be exposed in the same resist film at a lower dose, causing only the positive tone function to be expressed in that portion of the resist. This effect could also be accomplished with a single expose process if, for example, the reticle contained a partial filter of the actinic radiation in the areas where a lower exposure dose was desired. This allows wider spaces to be printed at the same time as the narrower features, which is necessary in some device applications.

In a modification of this two-step imaging approach, a hybrid resist can be used to create a standard negative tone pattern. If the resist film is image-wise exposed with a standard negative tone reticle, baked to form the hybrid image, then blanket exposed with actinic radiation and developed without a second post-expose bake process, the result is a standard negative tone image. This approach may be desirable in some applications, such as the formation of gate conductor circuits, which require very small lines to be printed, but do not require a high density image pitch. As an alternative to this method, the resist may be blanket exposed to a low dose of actinic energy after the image-wise exposure and before the baking step. The desirability of the method would depend on whether a solubility inhibiting protective group is present on the resin and whether the positive tone response is temperature dependent.

Figure 2:
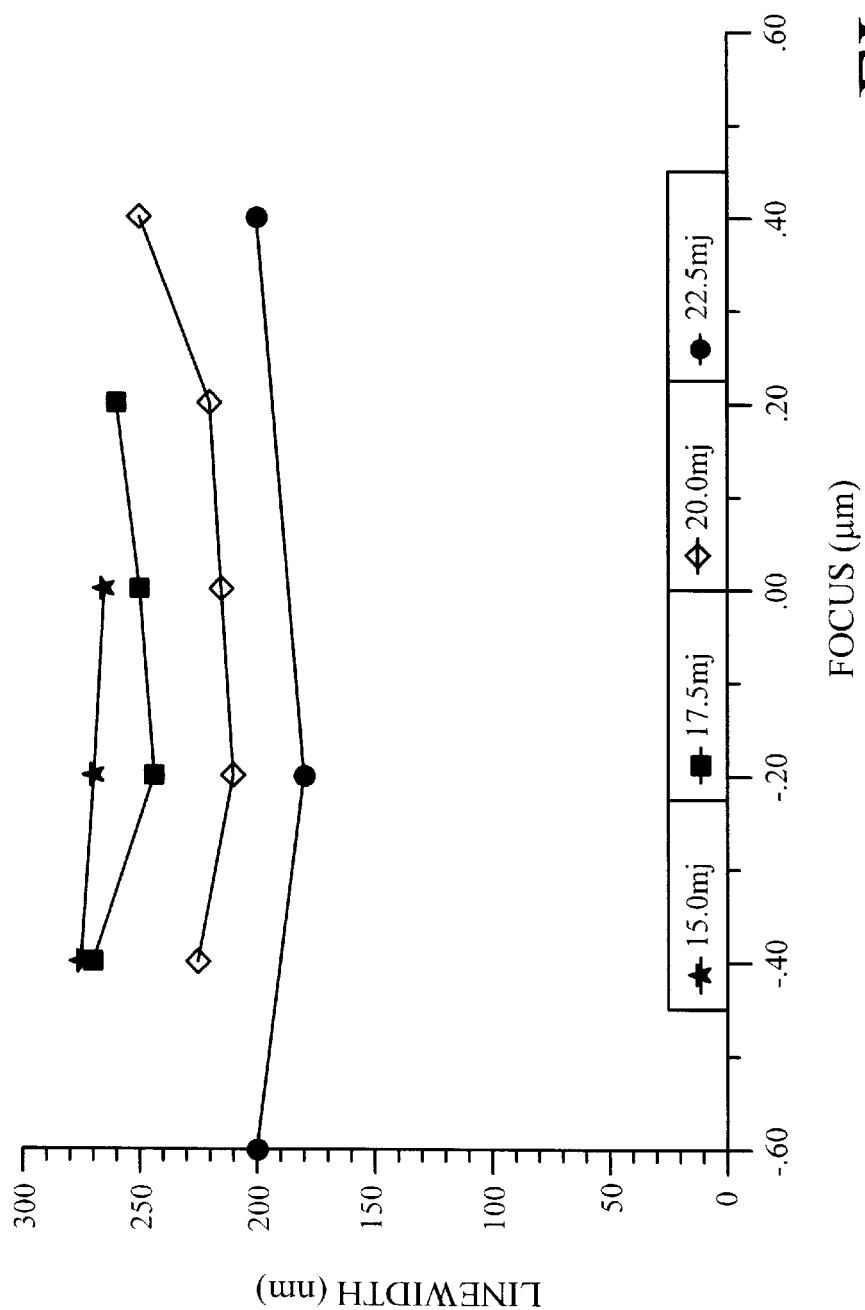
FIG. 2 is a graph of linewidth in nanometers (nm) plotted against focus in microns ($\mu$m) of a formulation of a standard negative resist at various exposure energies.
Figure 3:
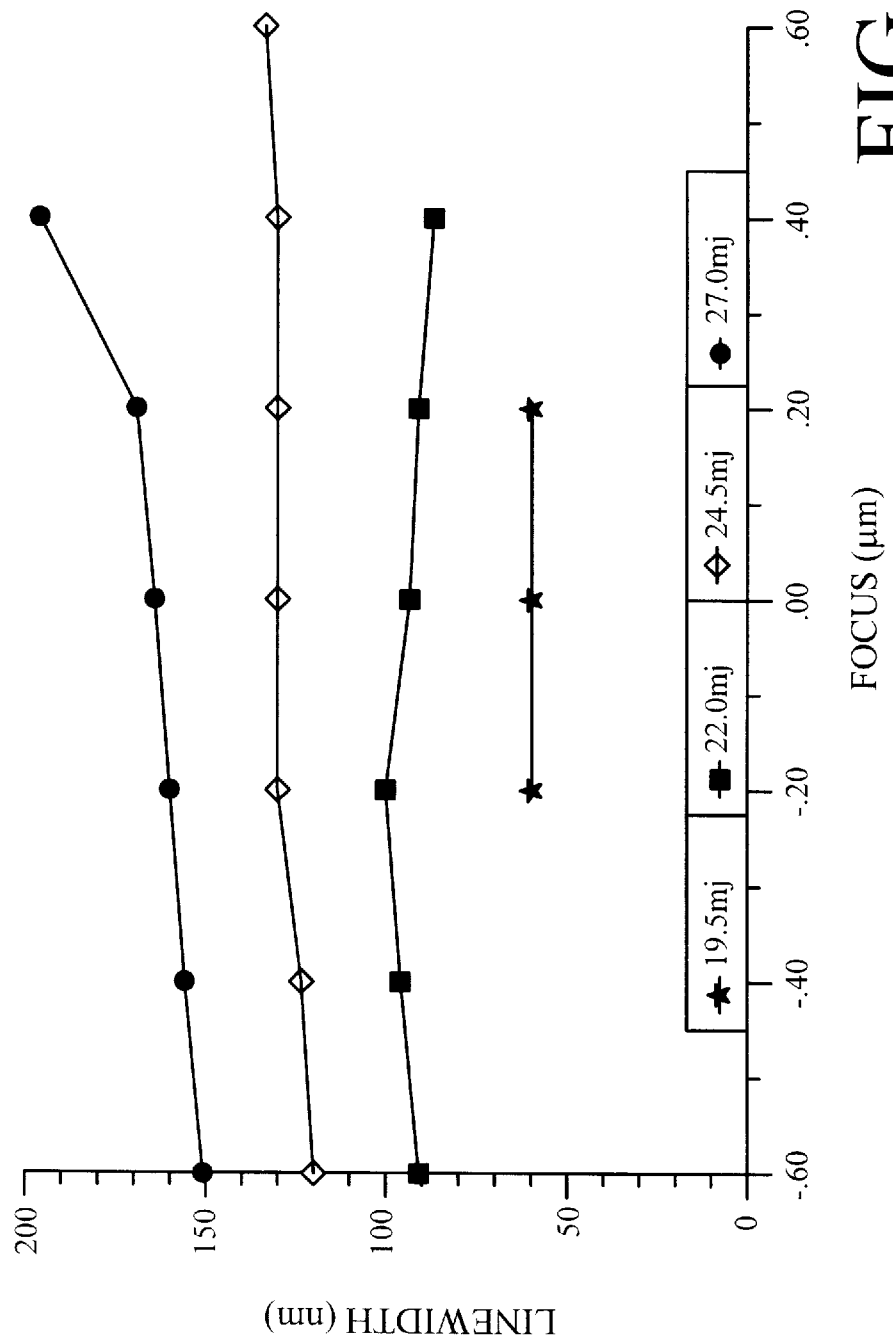
FIG. 3 is a graph of linewidth for a negative tone line of a hybrid pattern in nm plotted against focus in $\mu$m of a hybrid resist of the present invention at various exposure energies.

An advantage of using the hybrid resist in such applications is that the negative tone line of the hybrid resist can exhibit a large print bias at its isofocal point, as shown in FIG. 3. In other words, at the point of largest process latitude for the hybrid negative tone line, the resist image size can be substantially smaller than the reticle image size. This is desirable because the aerial image is less degraded by diffraction effects at the larger reticle size, thus allowing a larger depth of focus to be attained than is possible with conventional positive and negative tone systems, as shown in FIG. 2. This print bias is a result of the fact that the edge of the chrome line prints as a space. The space, in effect, acts to 'trim' the edges of the aerial image, causing the negative line to print smaller than it would with a conventional negative resist. This is an expression of the frequency doubling character of a hybrid resist.

It is possible to design the resist formulation to optimize the print bias of the negative tone line. For example, by choosing an appropriate loading factor for the positive tone solubility inhibitor, one may obtain a particular print bias as shown in FIG. 4. In theory, it is quite obvious that similar variations in the photoresist response can also be brought about by making appropriate changes in concentrations and reactivities of other components as well.

Figure 5:
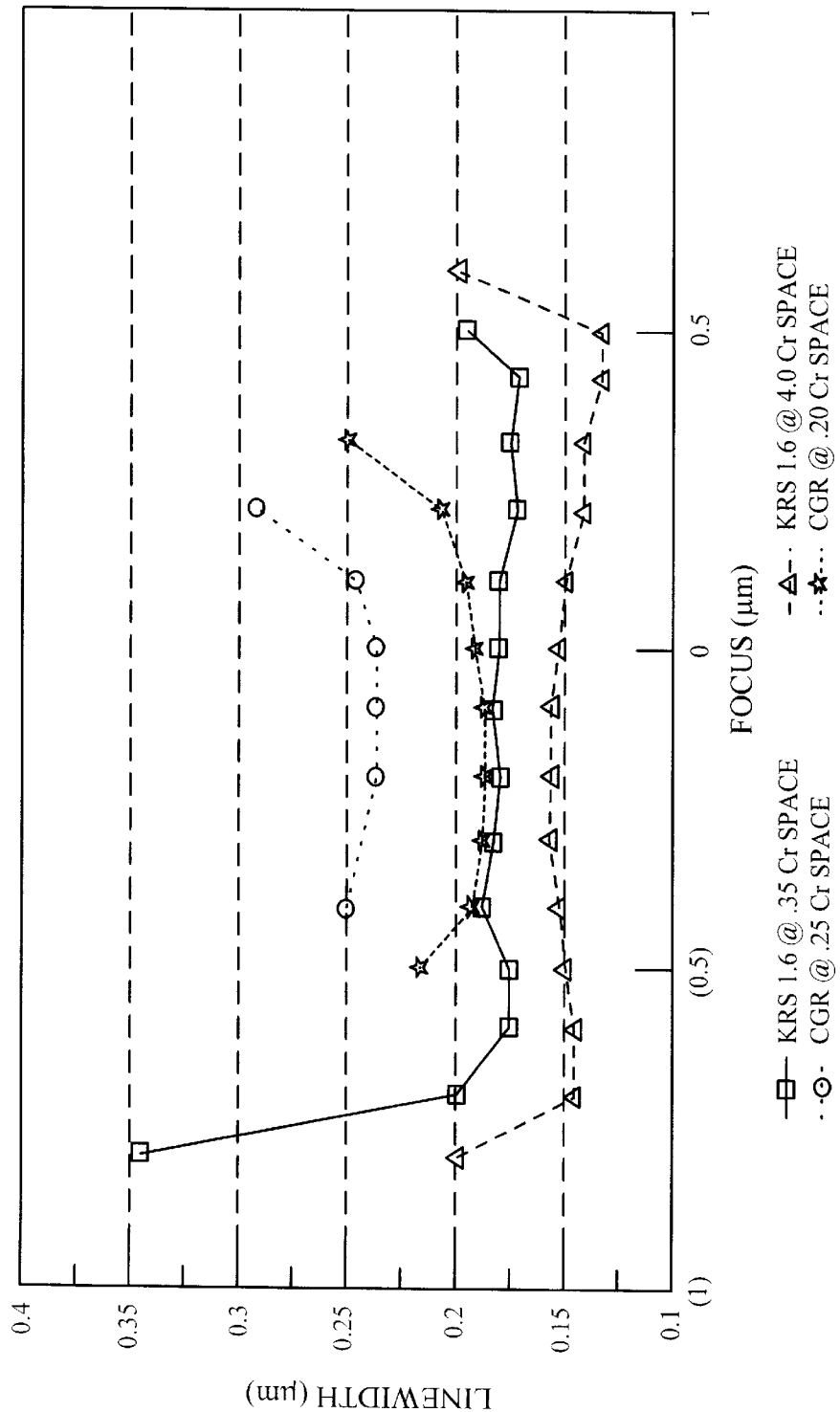
FIG. 5 is a comparative model of what the range of focus is for a given linewidth using standard resist formulations and a hybrid resist formulation of the present invention.

For example, we have found that with exposure on a DUV 0.5 NA lithography tool, the isofocal print bias for a hybrid resist can be 0.11 µm larger than the isofocal print bias for a standard negative tone resist, as exemplified in FIGS. 2 and 3 when standard calculations known in the art are performed on the data. This difference can be utilized in two ways. In one approach, the same reticle image size could be used with the hybrid resist to print a smaller line than the standard resist, while maintaining focus and exposure process latitude. In another manner of use, the size of the reticle features could be increased with the hybrid resist relative to the standard resist, while printing the same image size as the standard resist. The use of a larger reticle image provides a larger depth of focus due to reduced diffraction effects, as shown in the graph of FIG. 5. In the former application, higher performance is achieved with the smaller size of the hybrid resist. In the latter application, higher yield is achieved due to the larger process latitude of the hybrid resist.

The resist formulations may be varied to obtain a high photospeed positive tone reaction and a low photospeed negative tone reaction for optimal results. Additionally, the positive tone resist may be chosen so that it is insensitive to post expose bake (PEB) conditions so that the ratio of sensitivity of the positive tone to the negative tone function can be altered, thus changing the ratios of the space/line/space combinations.

Another option for changing the space/line/space ratios is to utilize a gray-scale filter in the reticle of the exposure tool. A gray scale filter only allows a portion of the radiation to pass through the reticle, thereby creating areas of intermediate exposure. This prevents the negative tone resist function from operating in these areas because the exposure dose would never reach the critical point, but would still allow the positive functions to occur, thereby creating wider spaces. This allows wider spaces to be printed at the same time as the narrower features, which is necessary in some device applications.

In a further processing refinement, the features that are typically obtained can be trimmed with a second masking step if they are not desired.

The following examples are exemplary of the frequency doubling resist composition, but are not meant to be limiting and many variations will be readily apparent to one of ordinary skill in the art.

The photoresist resins suitable for use in accordance with the invention include any of the base-soluble, long chain polymers suitable for use as a polymer resin in a photoresist formulation. Specific examples include: (i) aromatic polymers having an —OH group, e.g., polyhydroxystyrenes such as poly (4-hydroxystyrene), poly (3-hydroxystyrene), commercially available from Hoechst Celanese of Corpus Christi; Tex., novolak resins commercially available from Shipley of Marlboro, Mass.; and polymers having a phenolic —OH group, e.g., phenol formaldehyde resins; (ii) polymers having an acid group, e.g., polymethacrylic acid with an ester side chain; and (iii) acrylamide group type polymers.

The polymer resin in its deprotected form (i.e., once the positive tone reaction has occurred) is base soluble and compatible with developer solutions, such as aqueous solutions of metal-free ammonium hydroxide, tetramethylammonium hydroxide, and tetraethyl ammonium hydroxide, metal containing potassium hydroxide, and sodium metasilicate. Preferred polymer resins have an average molecular weight within the range of about 1,000 daltons to about 250,000 daltons, and most preferably within the range of about 1,000 to 25,000 daltons, to enhance its solubility in developer solutions. Examples include p-hydroxystyrene-maleic acid anhydiride copolymers, polyhydroxystyrene-p-tertiarybutyl-carganatostyrene co-polymers, poly(2-hydroxystyrene), phenol-formaldehyde resins, polymethyl methacrylate-tertiary butyl methacrylate-polymethacrylic acid terpolymers, poly-4-hydroxystyrene-tertiary butyl methacrylate copolymers, poly(4-hydroxystyrene) with one or more acid labile alkyl or aryl substituents on the aromatic ring, a poly(3-hydroxystyrene) with one or more alkyl or aryl substituents on the aromatic ring, or any of these as the major number of subunits in a copolymer, such as PHM-C, commercially available from Maruzen America of New York, N.Y. The PHM-C includes both poly (hydroxystyrene) subunits and vinyl cyclohexanol subunits preferably being in the range of about 99:1 to about 50:50. The most preferred ratio is about 90 poly (hydroxystyrene) units to about 10 vinyl cyclohexanol subunits.

Crosslinking compositions are preferably tetramethoxymethyl glycouril ("Powderlink") and 2,6-bis(hydroxymethyl)- p-cresol. However, other possible crosslinking compositions include:

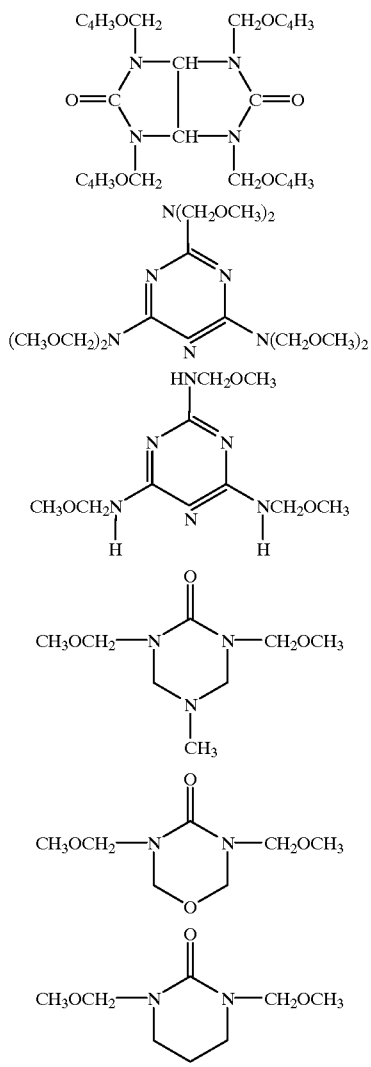

their analogs and derivatives, as can be found in Japanese Laid-Open Patent Application (Kokai) No. 1-293339, as well as etherified amino resins, for example methylated or butylated melamine resins (N-methoxymethyl- or N-butoxymethyl-melamine respectively) or methylated/butylated glycol-urils, for example of the formula:

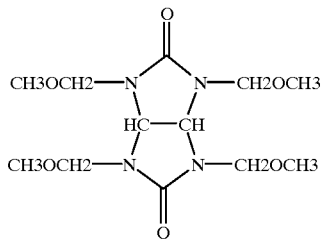

as can be found in Canadian Patent No. 1 204 547.

Photoacid generators ("PAG") include, but are not limited to: N-(trifluoromethylsulfonyloxy)-bicyclo[2.2.1]hept-5-ene-2,3-dicarboximide ("MDT"), onium salts, aromatic diazonium salts, sulfonium salts, diaryliodonium salts and sulfonic acid esters of N-hydroxyamides or -imides, as disclosed in U.S. Pat. No. 4,731,605, incorporated herein by reference. Also, a PAG that produces a weaker acid such as dodecane sulfonate of N-hydroxy-naphthalimide ("DDSN") may be used.

Possible base additives include, but are not limited to: dimethylamino pyridine, 7-diethylamino-4-methyl coumarin ("Coumarin 1"), tertiary amines, proton sponge, berberine, and the polymeric amines as in the "Pluronic" or "Tetronic" series from BASF. Additionally, tetra alkyl ammonium hydroxides or cetyltrimethyl ammonium hydroxide, may be used when the PAG is an onium salt.

Examples of sensitizers that may be utilized include: chrysenes, pyrenes, fluoranthenes, anthrones, benzophenones, thioxanthones, and anthracenes, such as 9-anthracene methanol (9-AM). Additional anthracene derivative sensitizers are disclosed in U.S. Pat. No. 4,371,605, which is incorporated herein by reference. The sensitizer may include oxygen or sulfur. The preferred sensitizers will be nitrogen free, because the presence of nitrogen, e.g., an amine or phenothiazine group, tends to sequester the free acid generated during the exposure process and the formulation will lose photosensitivity.

A casting solvent is used to provide proper consistency to the entire composition so that it may be applied to the substrate surface without the layer being too thick or too thin. Sample casting solvents include: ethoxyethylpropionate ("EEP"), a combination of EEP and γ-butyrolactone ("GBL"), and propylene-glycolmonoethylether acetate (PM acetate).

In the following Examples, one of each of these has been chosen, however, it is to be recognized that many other compositions may be selected for various portions of the resist. In the broadest sense, the method and structure of the preferred embodiment may be achieved using any hybrid resist is comprised of a negative tone component and a positive tone component, wherein the positive tone component acts at a first actinic energy level and the negative tone component acts at a second actinic energy level, the first and second actinic energy levels being separated by an intermediate range of actinic energy levels.

EXAMPLE 1

The following compositions were dissolved in propylene-glycol monomethylether acetate (PM acetate) solvent available from Pacific Pac, Inc., Hollister, Calif. containing 350 ppm of FC-430, a non-ionic fluorinated alkyl ester surfactant available from 3M, St. Paul, Minn. for a total of 20% solids:

poly(hydroxystyrene) (PHS), 10% hydrogenated, available from Maruzen America, New York, N.Y. with about 25% of the phenol groups protected with methoxypropene (MOP), 81.2% of solids;

N-(trifluoromethylsulfonyloxy)-bicyclo-[2.2.1]-hept-5-ene-2,3-dicarboximide (MDT), available from Daychem Labs, Centerville, Ohio, 10.5% of solids;

tetramethoxymethyl glycouril (Powderlink), available from Cytec, Danbury, Conn., 8.2% of solids; and 7-diethylamino-4-methyl coumarin dye (Coumarin 1), available from the Aldrich Chemical Company, 0.1% of solids.

Figure 6:
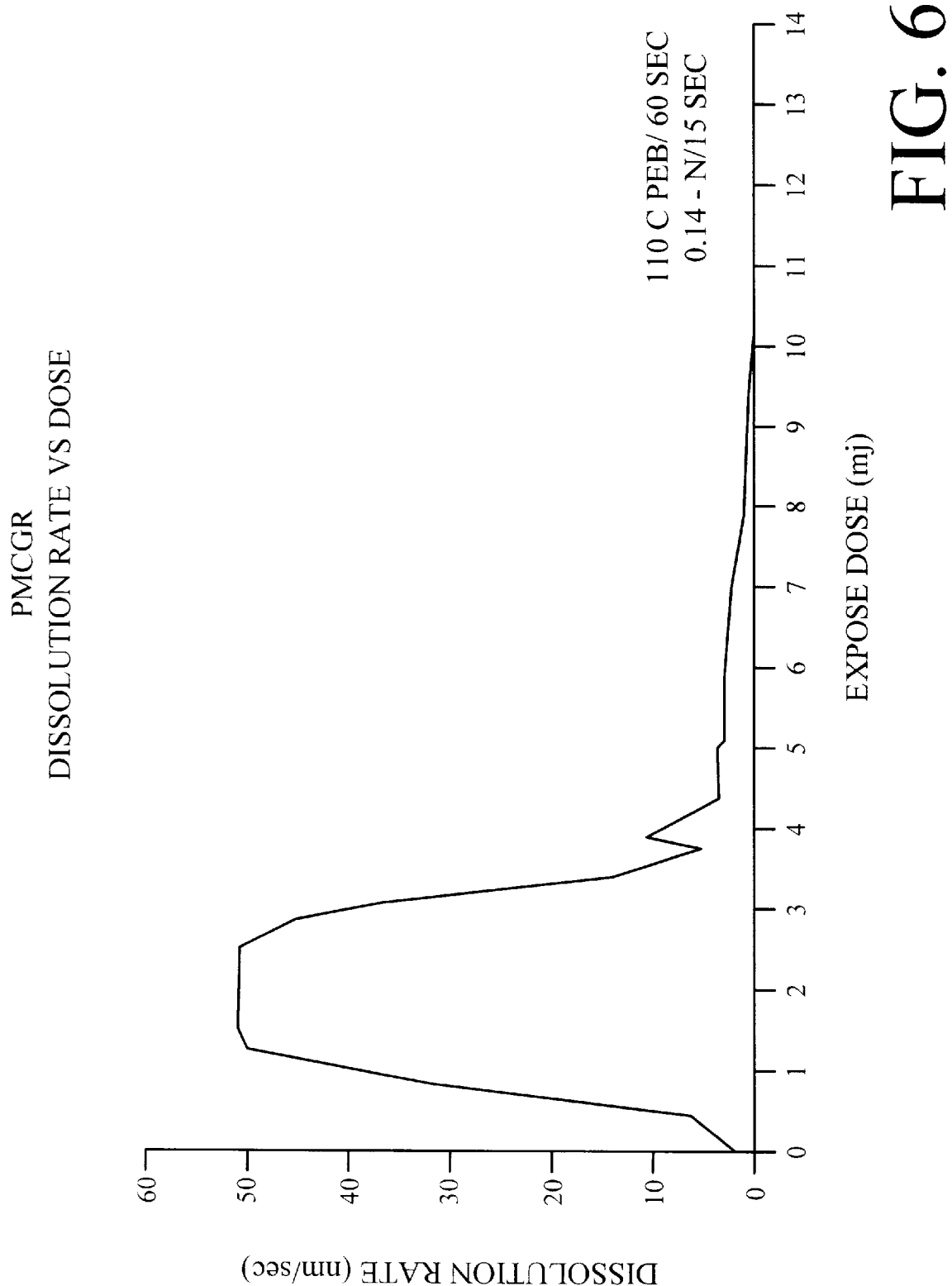
FIG. 6 is a graph showing the dissolution rate in nanometers per second (nm/sec) as a function of the exposure dose in milliJoules (mJ) using one formulation of a hybrid resist of the present invention.

The solution was filtered through a 0.2 μm filter. The solution was coated onto silicon wafers primed with hexamethyl-disilazane with a soft bake of 110° Celsius (C.) resulting in films of about 0.8 μm thick as determined by a Nanospec reflectance spectrophotometer. The coated wafers were then exposed with deep ultraviolet (DUV) excimer laser radiation having a wavelength of 248 nm in a 0.37 numerical aperture (NA) Canon stepper with a matrix of different doses from low doses to high doses and post expose baked (PEB) at 110° C. for 90 sec. The dissolution rates of the exposed films were calculated from the thickness of remaining film after developing for a given amount of time with 0.14 Normal (N) tetramethylammonium hydroxide (TMAH) developer. The dissolution rate vs. exposure dose relationship is shown in FIG. 6. As shown in FIG. 6, the resist has a very low dissolution rate (about 2 nm/sec) when unexposed. As the dose is increased, the dissolution rate increases until reaching about 50 nm/sec. The dissolution rate remains relatively constant at this level in the dose range of about 1milliJoule (mJ) to about 3mJ. Increasing the dose further, the negative cross-linking chemistry becomes predominant and the dissolution rate falls back to a value close to zero.

Figure 10:
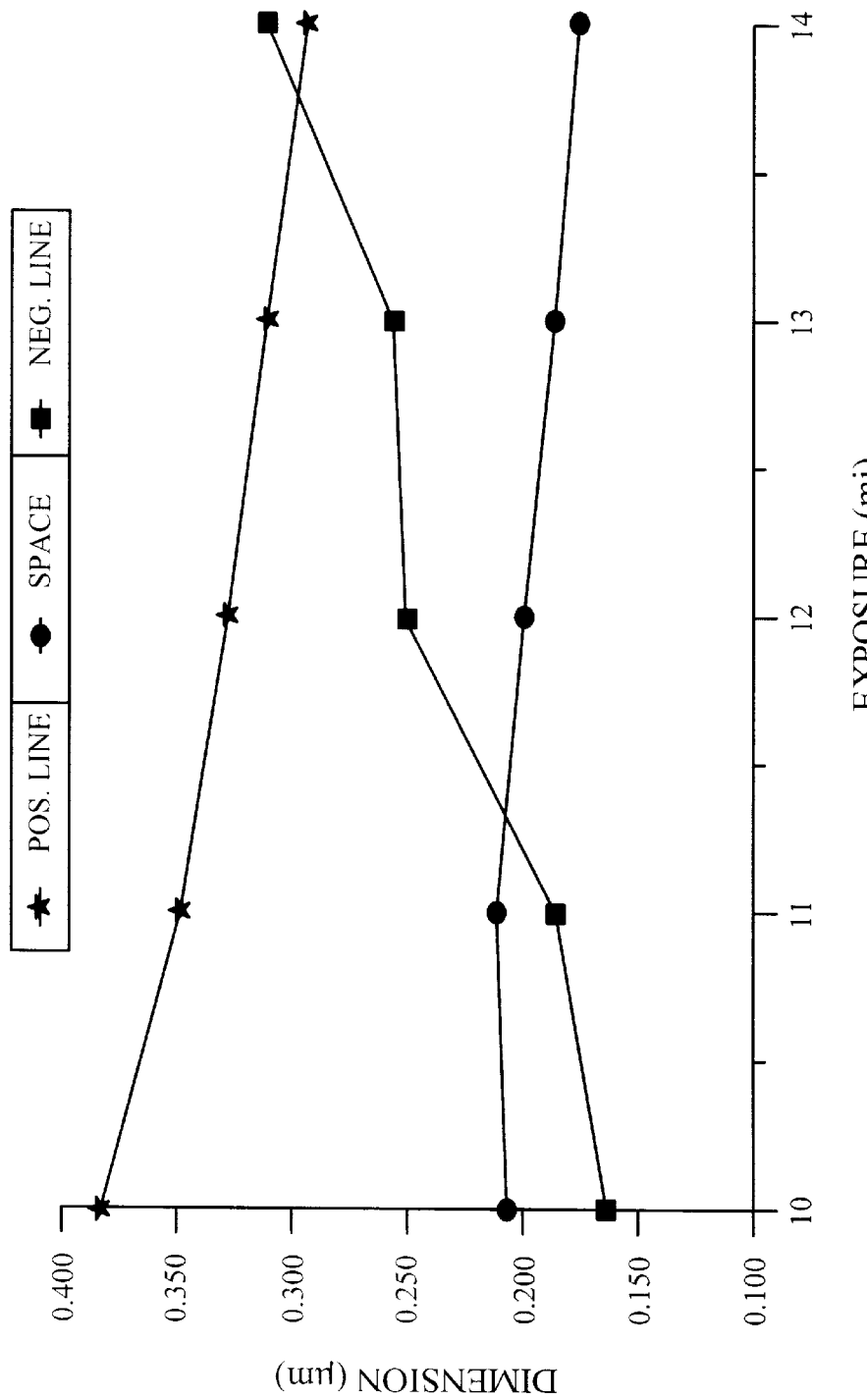
FIG. 10 is a graph of the response of a formulation of the hybrid resist of the present invention in which exposed (negative) line, unexposed (positive) line and space widths are plotted as a function of exposure dose.

A typical lithographic response of this resist is illustrated in FIG. 10, which shows the outcome of exposing the resist through a mask having 1 μm wide nested chrome lines at a pitch of 2 μm with a 248 DUV stepper with a 0.37 NA. Every chrome line and space combination in the mask prints as two lines and two spaces on the resist: a negative tone line of about 0.8 μm, a positive tone line of about 0.6 μm and two equal spaces of about 0.3 μm.

Figure 7:
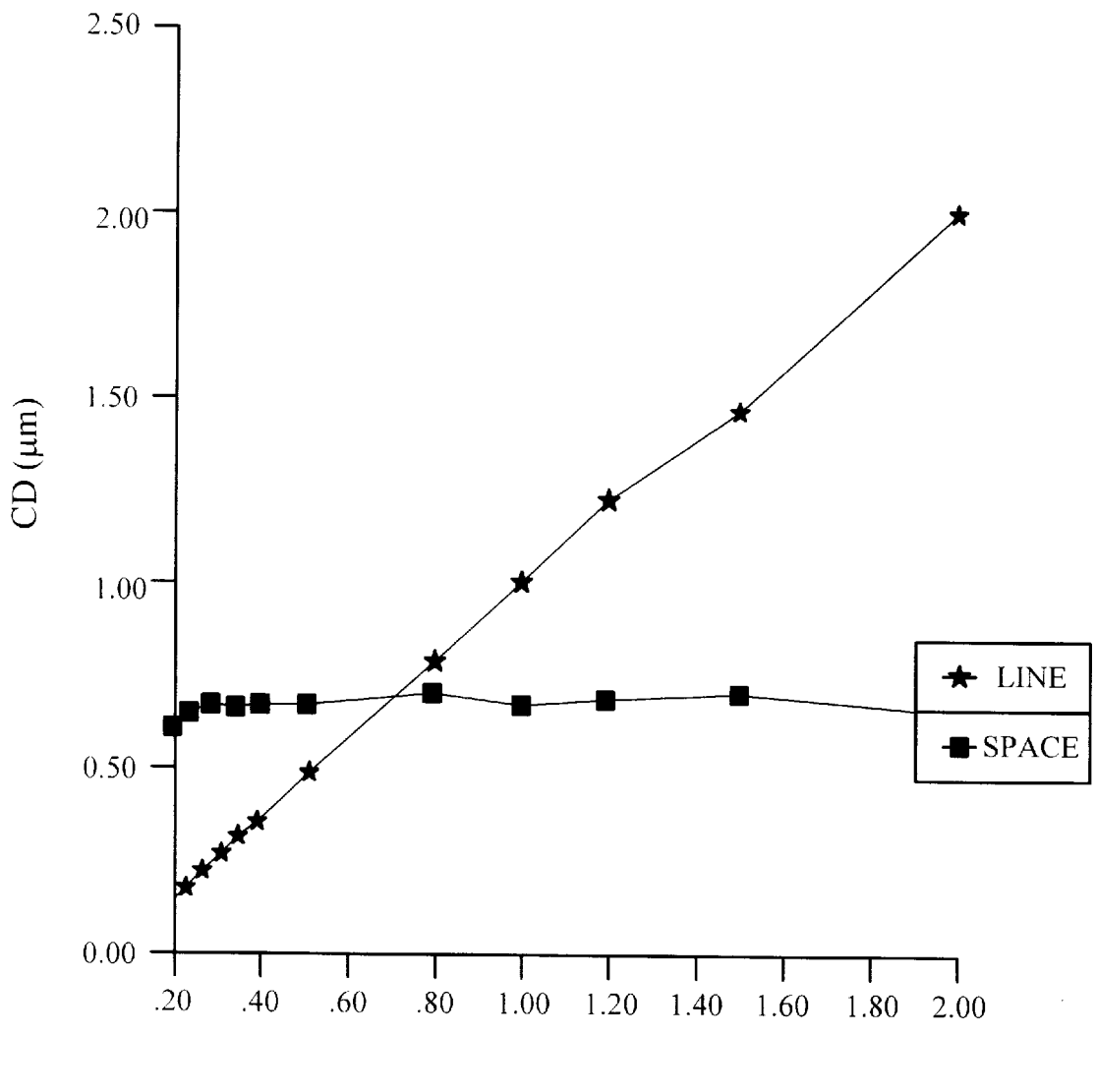
FIG. 7 is a graph showing the resultant line and space widths as functions of the chrome space width using one formulation of a hybrid resist of the present invention.

In another experiment with the same resist, when a MICRASCAN II 0.5NA DUV stepper is used to expose an isolated chrome space onto the hybrid resist film, the space/line/space measurements as a function of width of the chrome space are plotted, as shown in FIG. 7. The data suggests that, although the width of the line increases correspondingly with that of the chrome space on the mask, the space on either side of the line remains relatively constant.

EXAMPLE 2

This example illustrates the manner in which changing the type of photoacid generator and relative amounts of the various components can change the dissolution rate characteristics of the hybrid resist and subsequently the lithographic response. This second formulation was prepared and processed in a manner similar to EXAMPLE 1, however, it is comprised of the following components:

PHS with about 25% of the phenol groups protected with MOP, 90.8% of solids;

triphenyl sulfonium triflate, 1.3% of solids;

Powderlink, 7.8% of solids;

tetrabutyl ammonium hydroxide base, 0.1% of solids; and sufficient PM acetate containing 350ppm FC430 surfactant as a solvent to form a 18.9% solids solution.

Figure 8:
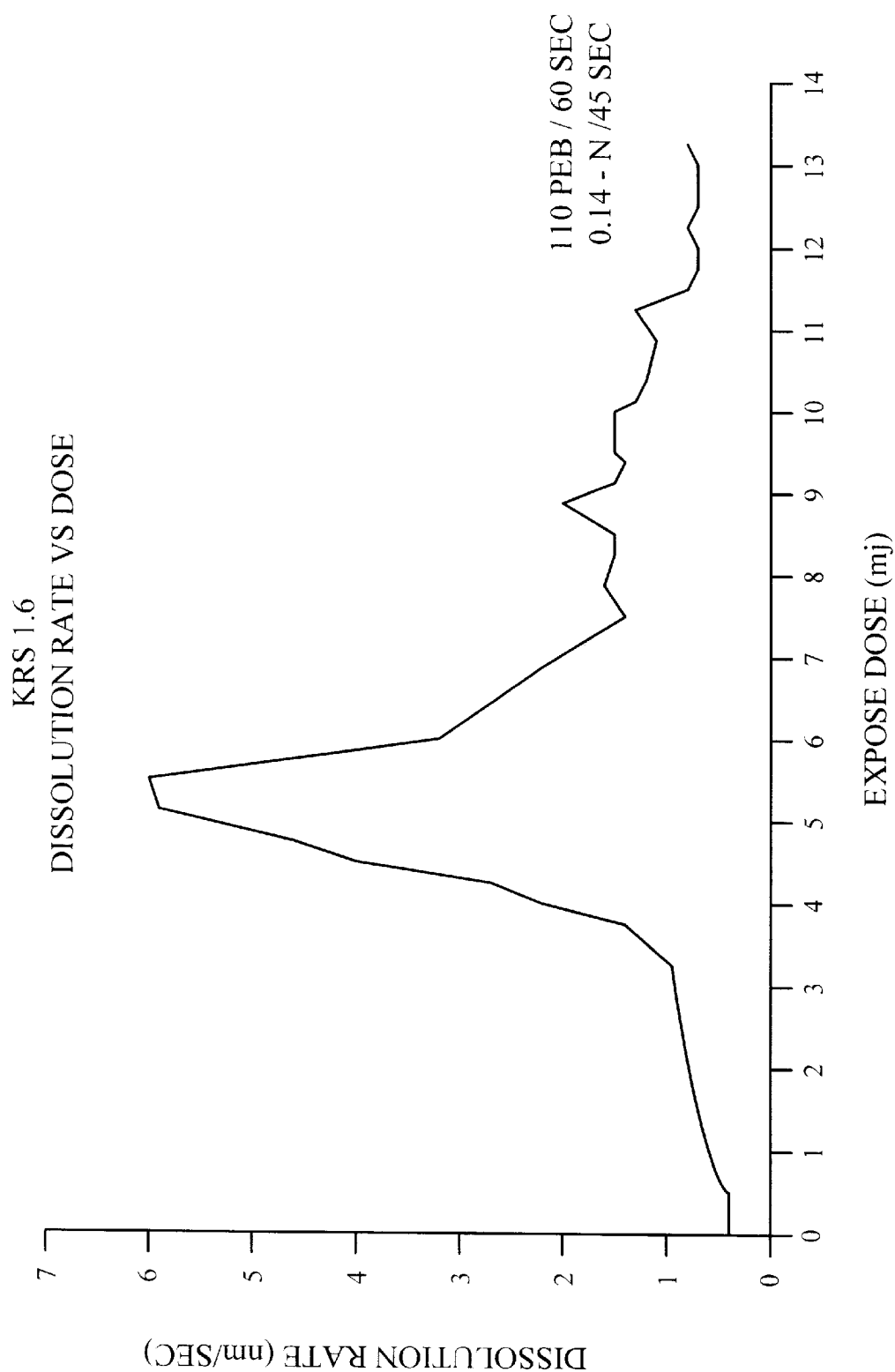
FIG. 8 is a graph showing the dissolution rate of an alternative formulation of the hybrid resist in nm/sec as a function of the exposure dose in mJ.

The dissolution rate characteristic of the resulting hybrid resist is shown in FIG. 8. The overall nature of the curve remains similar to that shown by the hybrid resist of EXAMPLE 1, in that the dissolution rate starts out low for an unexposed resist, increases to a high at about 5mJ and decreases to a low above 7mJ. However, the absolute dose range and the dissolution rates within these ranges are quite different from those shown in FIG. 6.

FIG. 10 represents the response of this formulation of the hybrid resist when exposed through a mask of nested chrome lines and spaces of equal widths in a MICRASCAN II DUV 0.5 NA stepper tool. Negative line, unexposed (positive) line and space widths are plotted as a function of mask dimension. The space remains relatively constant in the range of about 0.18 μm, whereas both lines vary as the mask dimension is varied.

EXAMPLE 3

This example illustrates that the space width of the frequency doubled image can be changed by varying the protection level of PHS with MOP. Two different PHS lots having 24% and 15% MOP loading, respectively, were used to make hybrid formulations identical to that of EXAMPLE 1, except that the total solids contents were adjusted to 16.0% of the total to obtain film thicknesses of about 0.5 μm. From these two stock formulations, several other formulations with average MOP levels ranging from 15 to 24% were prepared. Wafers were coated and soft baked at 110° C., exposed on a MICRASCAN II DUV 0.5 NA stepper, post exposed baked at 110° C. for 60 sec and finally developed with 0.14 N TMAH developer. A reticle with an isolated chrome opening was printed in a hybrid resist film. The spacewidth of the resist image was measured and graphed as a function of the average MOP solubility inhibitor loading in the PHS used for making the respective formulations. It was found that the space width was strongly dependent on MOP concentration, as shown in FIG. 9.

EXAMPLE 4

Negative tone imaging may be performed with the hybrid resist of the present invention, using a blanket DUV expose after the PEB and prior to the develop.

A hybrid resist formulation as described in EXAMPLE 2, above, was image-wise exposed with a chrome reticle with an electrical test pattern on a 0.5NA DUV expose system. Silicon wafers (200 mm) with a 2000 Angstrom (Å) film of polysilicon were used as a substrate so that the resulting etched patterns of the resist image could be measured with electrical probe techniques. After the post expose bake process, the wafers were cycled back into the expose tool (MICRASCAN II) and exposed at 10mJ per square centimeter ($cm^2$) with a clear glass reticle. A post expose bake process was not performed after the second exposure. The purpose of the second exposure was to remove the initially unexposed resist from the wafer, leaving only a negative tone resist pattern after develop.

The initial image-wise expose dose was 17–24 mJ/cm2, the post expose bake temperature was 110° C. for 90 sec and the develop time was 100 sec in 0.14 N TMAH. A standard negative tone resist was processed in a similar fashion, with the omission of a blanket expose step as a control. The electrical data from this experiment is shown in FIGS. 2 and 3. A large isofocal print bias of approximately 0.11 μm was observed for the hybrid resist relative to the standard negative resist, as calculated using standard methods known in the art.

Preferred Embodiments

Figure 11:
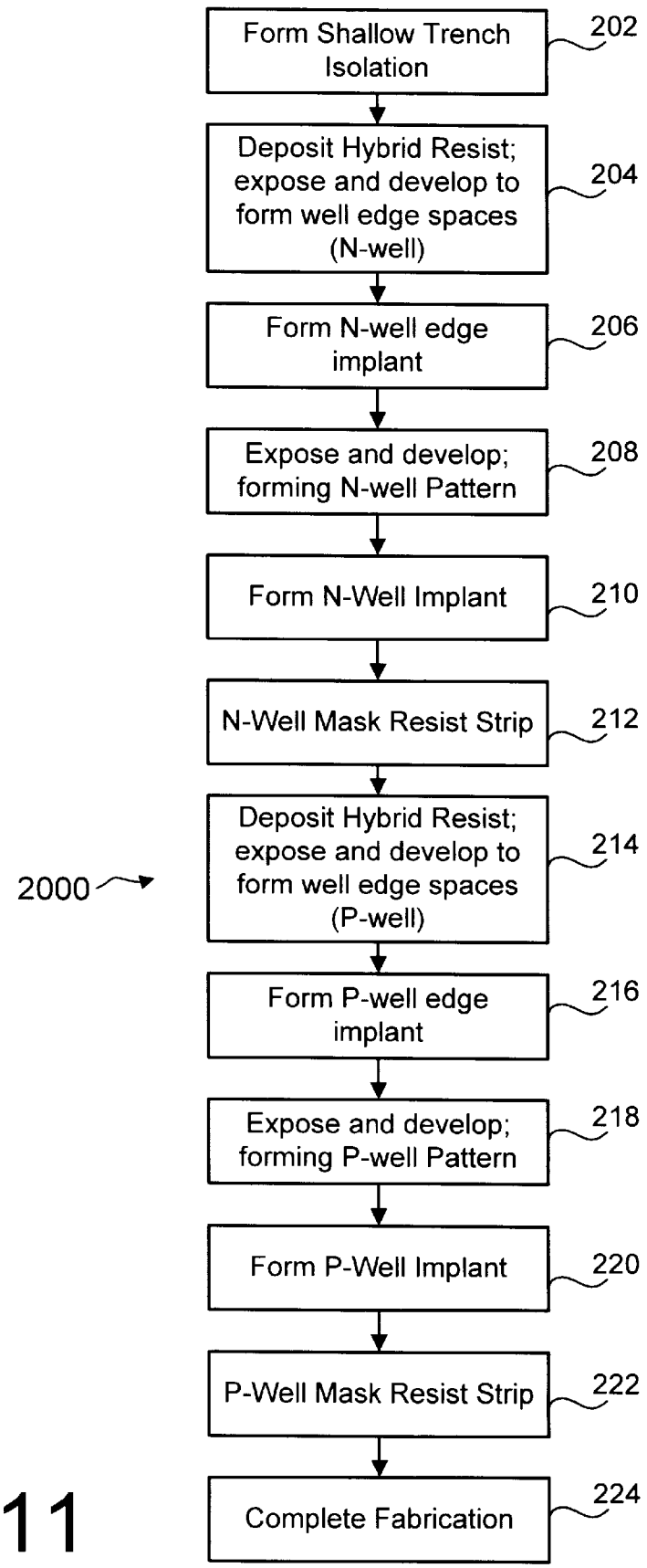
FIG. 11 is a schematic flow diagram representing a fabrication method in accordance with the preferred embodiment.

Turning to FIG. 11, a preferred method 2000 for forming well edge implants to reduce latch-up susceptibility in CMOS devices is illustrated. The well edge implants reduce the susceptibility to latch-up by reducing minority carrier lifetimes and hence reducing the gain of parasitic transistor structures. The method 2000 forms well edge implants without requiring additional mask steps.

The preferred method begins with a semiconductor substrate as is commonly used in CMOS devices. An example of such a substrate is a wafer portion with a P+ substrate and a P– epitaxial layer at the top portion. Of course other suitable substrate materials can be used. The preferred method will now be described with reference to a first embodiment illustrated in FIGS. 12–19 and then with reference to a second embodiment illustrated in FIGS. 20–23.

The first step 202 is to form isolation regions between devices. These isolation regions, preferably shallow trench isolation, are used to separate n-channel from p-channel devices. The STI can be formed with any suitable processing method. One such method uses reactive ion etching (RIE) to form the STI trench in the substrate. An oxide liner is then suitably grown on the walls and bottom of the STI trench. The STI trench is then filled, suitably with oxide, and the wafer 100 is planarized using chemical mechanical polish (CMP).

Figure 12:
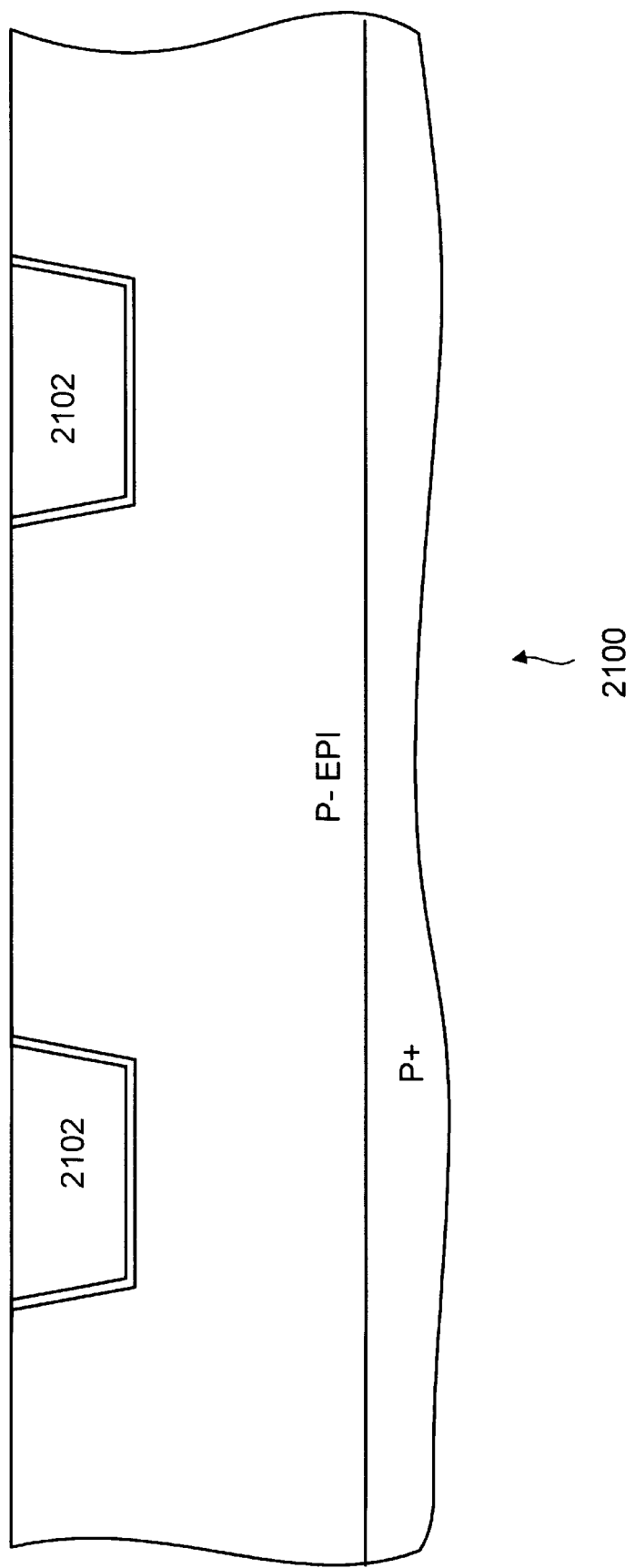
FIG. 12 is a cross-sectional side view of a wafer portion with shallow trench isolations formed within.

Turning to FIG. 12, a wafer portion 2100 is schematically illustrated (not to scale). The wafer portion 2100 includes a P− epitaxial layer 2110 atop a P+ substrate. In the wafer portion, two shallow trench isolations (STIs) 2102 are formed. STIs 2102 are exemplary of STIs that are suitably formed between various devices on a typical integrated semiconductor device. Further processing steps will form n-channel devices and p-channel devices on the wafer portion 2100. STIs such as STIs 2102 are suitably formed between these various devices (i.e., between two n-channel devices, between two p-channel devices and between an n-channel and a p-channel device). In all these cases the STIs 2102 serve to isolate adjacent devices from each other.

As will become clear, the preferred embodiment results in a reduced lifetime for carriers beneath the STIs 2102 and thus allows the STI's 2102 to be more shallow than prior art STI's and still maintain effective isolation between devices. Thus, the preferred embodiment improves the scalibility of STI's without decreasing the latch-up immunity.

Returning to the method 2000 illustrated in FIG. 11, the steps 204–212 form the N-wells and the N-well edge implants. In step 204 the hybrid resist properties result in the formation of openings in the resist at the N-Well mask edges.

The hybrid resist is first deposited across the surface of the wafer. The hybrid resist is then exposed to actinic radiation with the areas which are to be N-wells blocked with suitable mask shapes (i.e., chrome mask shapes). The hybrid resist is then developed. Hybrid resist portions which are unexposed (i.e., the N-well regions) remain insoluble in the developer and form positive tone line patterns. Hybrid resist portions which are exposed with high intensity radiation (i.e., the non-N-well regions) form a negative tone line image. Hybrid resist portions which are exposed with intermediate amounts of intensity (i.e., the edges of the N-Well regions) are dissolved during the development step.

Figure 13:
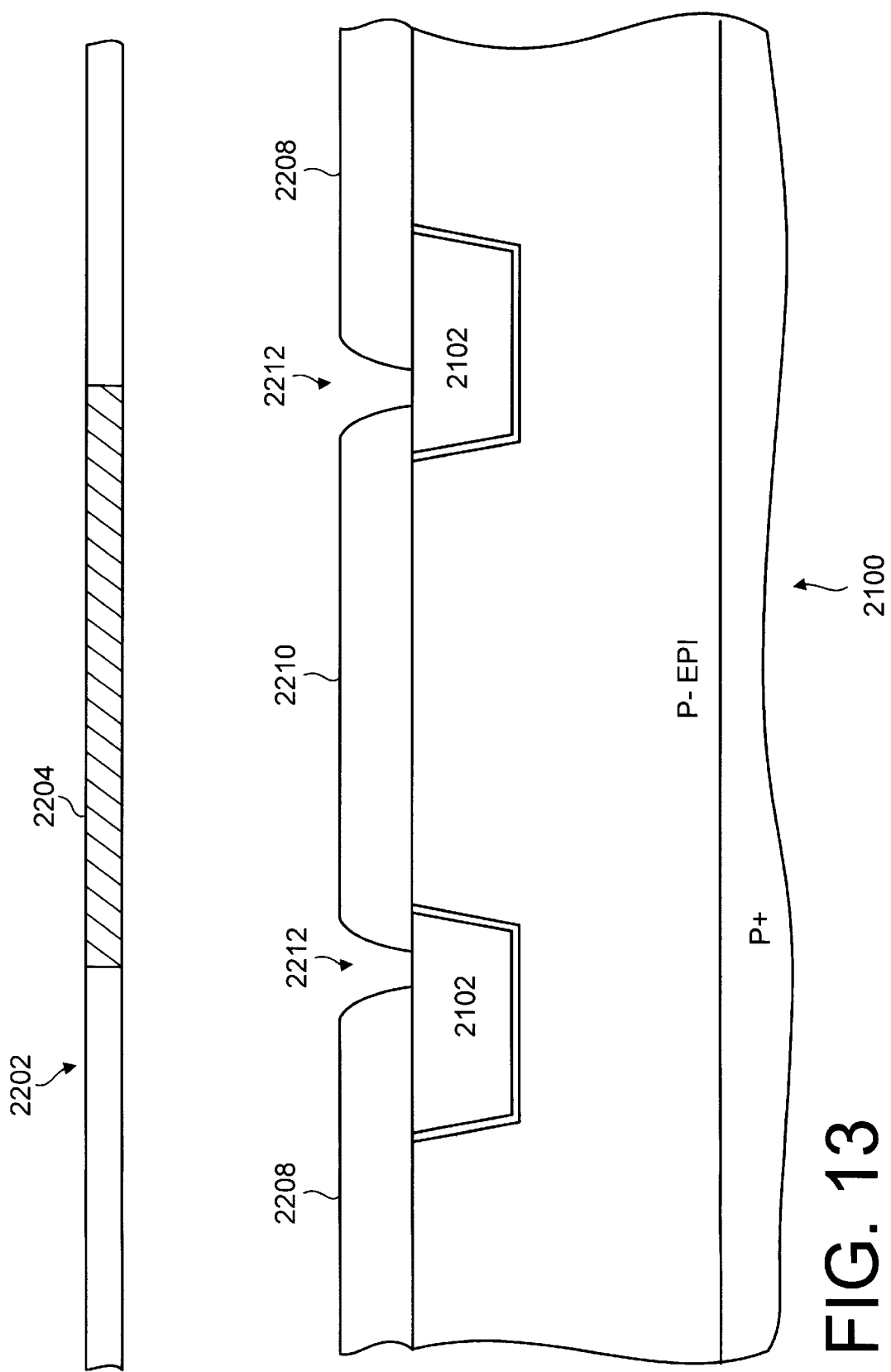
FIG. 13 is a cross-sectional side view of a wafer portion overlaid with hybrid resist and a mask used to pattern the resist for N-well edge implant formation and N-well formation.

Turning to FIG. 13, the wafer portion 2100 is illustrated with hybrid resist deposited across the surface that has been exposed and developed. A chrome region 2204 in mask 2202 blocks the N-well regions during actinic radiation exposure. Thus, the portions of the hybrid resist over the N-well regions are unexposed and hybrid resist portions over non-N-well regions are highly exposed, with areas of intermediate exposure in between. After development, a positive tone line pattern 2210 is formed above the N-well region and negative tone line patterns 2208 are formed above the non-N-well regions. Hybrid resist portions that were exposed to intermediate amounts of radiation are dissolved during developing, forming well edge spaces 2212 at the edges of the N-well regions. Because of the unique properties of hybrid photo resist, the well edge spaces 2212 can be with dimensions of 0.2 µm or less using lithography tools that are designed for operation at 0.35 µm resolution.

Returning to the method 2000 illustrated in FIG. 11, the next step 206 is to form N-well edge implants though the well edge spaces. In this embodiment, the N-well edge implants preferably comprise an N+ region around the edges of the N-well. The implants are preferably formed by implanting phosphorus (or other donor species such as arsenic (As) or antimony (Sb) through the well edge shapes. The amount of implant is selected to reduce minority carrier lifetimes, but should be done at a low enough dose so as not to destroy the photoactive compound in the hybrid resist. As such, the preferred implant is phosphorus and suitably implanted to a depth that is greater than the STI trench depth. The preferred dose is about 1E11 to 1E15 ions/sq-cm and the most preferred dose is about 1E13 ions/sq-cm.

Figure 14:
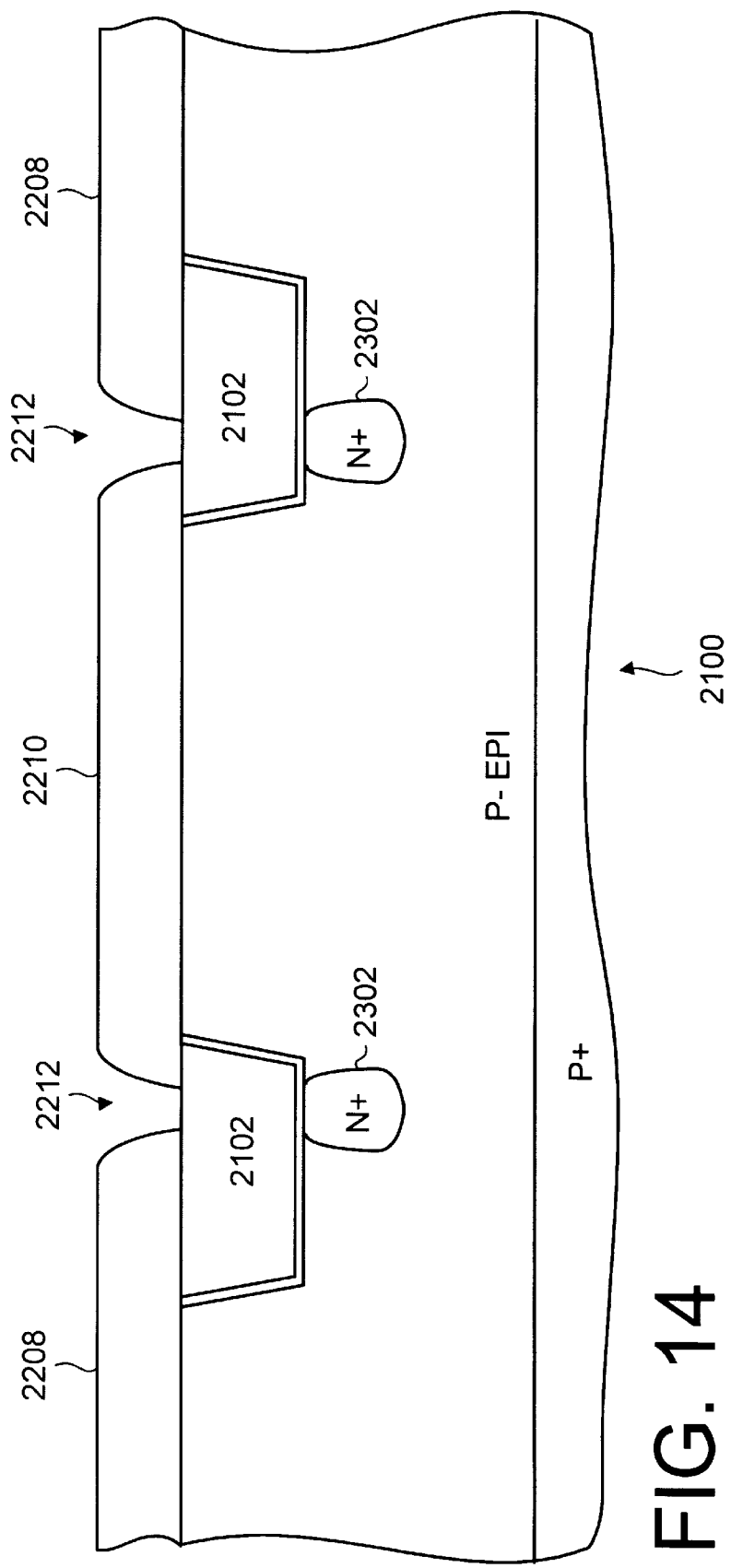
FIG. 14 is a cross-sectional side view of a wafer portion with N-well edge implants formed.

Turning to FIG. 14, the wafer portion 2100 is illustrated with n-well edge implants 2302 formed. Returning to the method 2000, the next step 208 is to expose and develop the N-well regions of the hybrid resist. Because the hybrid resist portion above the N-well regions were unexposed during actinic radiation exposure of step 204, those portions comprise positive tone patterns. Thus, the hybrid resist portions above the N-well regions can be removed by blanket exposing the wafer portion and developing away the positive tone patterns. Thus, this removal can be done without requiring additional masking layers or masking steps.

Figure 15:
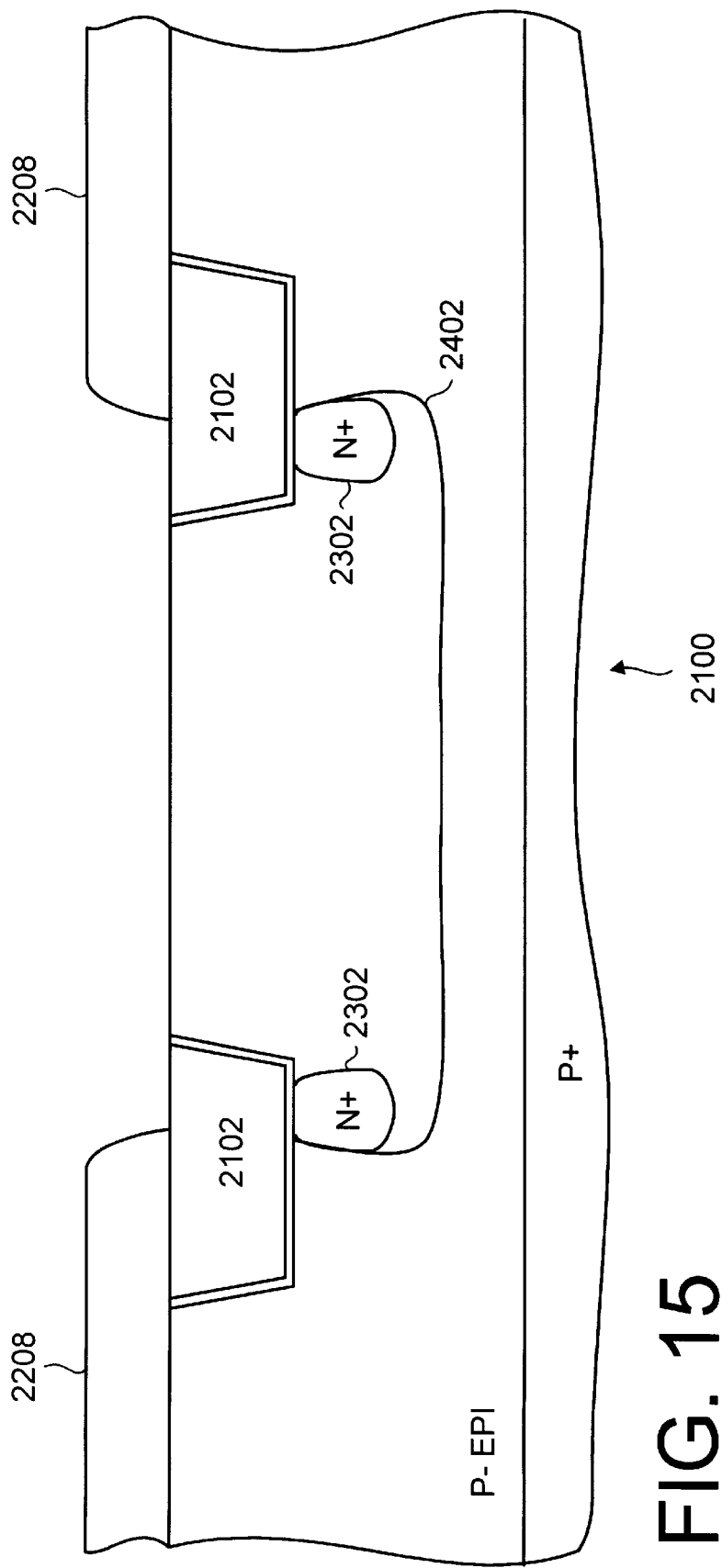
FIG. 15 is a cross-sectional side view of a wafer portion with N-well edge implants and the N-well formed.

At the next step 210, N-wells are formed using any suitable N-type implant technique. Turning to FIG. 15, the wafer portion 2100 is illustrated with the positive tone portion 2210 of the hybrid resist removed and an N-well 2402 implanted into substrate. The remaining negative tone portions 2208 serve to block off the non-N-well regions from receiving the N-type implant. Because the N-well edge implants 2302 share the same negative tone resist structures as the N-well 2402, they are self aligned to each other.

With the N-wells formed, the next step 212 is to strip the remaining portions (i.e., the negative tone portions 2208) of the hybrid resist.

With the N-wells and the N-well edge implants formed, the steps 214 through 222 form the P-wells and the P-well edge implants. At step 214, the P-well pattern is formed with hybrid resist and well edge spaces are formed at the P-well edges using the hybrid resist properties.

Again, hybrid resist is first deposited across the surface of the wafer. The hybrid resist is then exposed to actinic radiation with the areas which are to be P-wells blocked with suitable mask shapes (i.e., chrome mask shapes). The hybrid resist is then developed. Hybrid resist portions which are unexposed (i.e., the P-well regions) remain insoluble in developer and form a positive tone line pattern. Hybrid resist portions which are exposed with high intensity radiation (i.e., the non-P-well regions) form a negative tone line image. Hybrid resist portions which are exposed with intermediate amounts of intensity (i.e., the edges of the P-Well regions) are dissolved during the development step.

Figure 16:
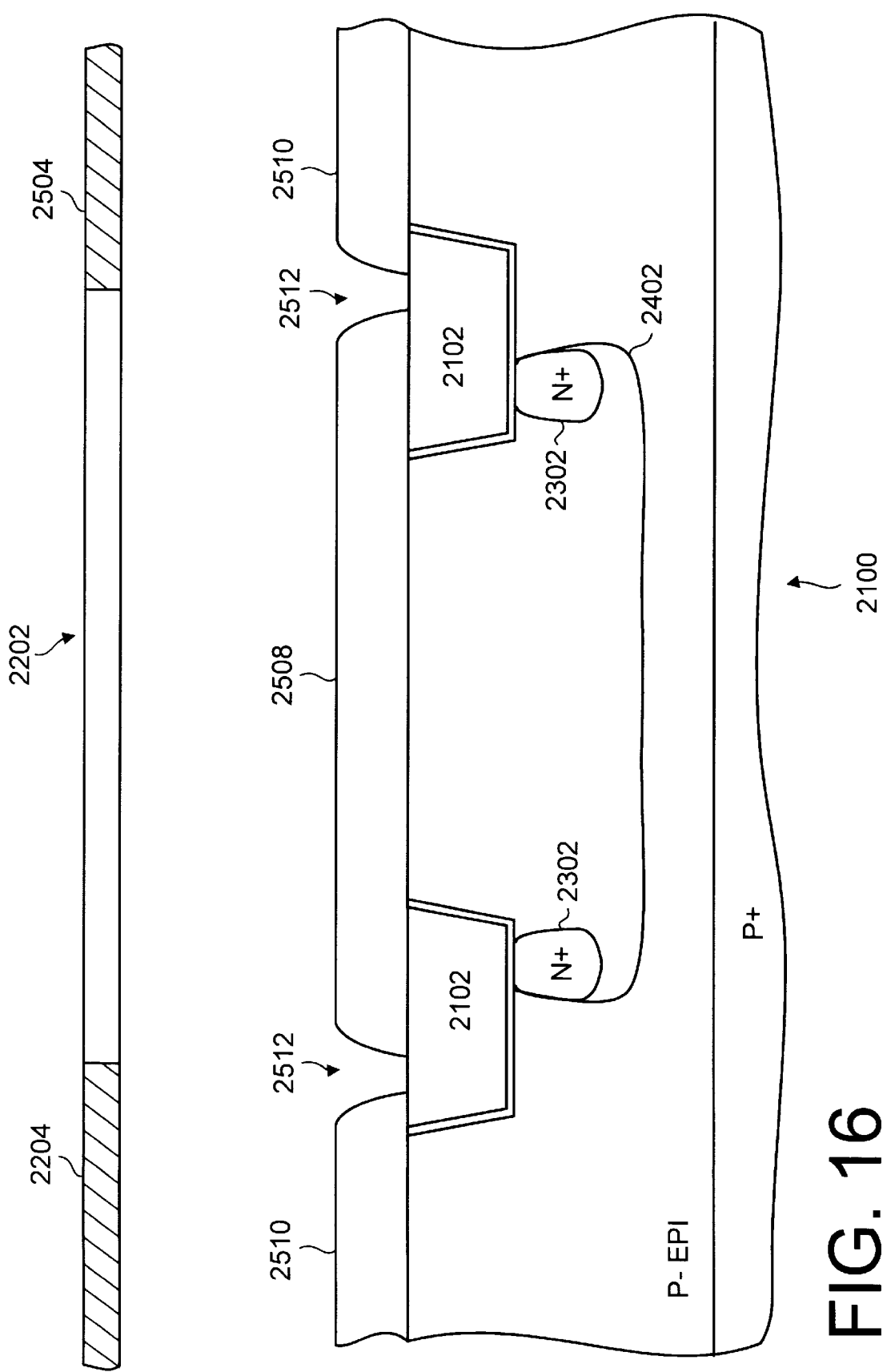
FIG. 16 is a cross-sectional side view of a wafer portion overlaid with hybrid resist and a mask used to pattern the resist for P-well edge implant formation and P-well formation.

Turning to FIG. 16, the wafer portion 2100 is illustrated with hybrid resist deposited across the surface that has been exposed and developed. Chrome regions 2504 in the mask 2502 block the P-well regions during actinic radiation exposure. Thus, the P-well regions are unexposed and non-P-well regions are highly exposed, with areas of intermediate exposure in between. After development, positive tone line patterns 2510 are formed above the P-well regions and a negative tone line pattern 2508 is formed above the non-P-well regions. Hybrid resist portions that were exposed to intermediate amounts of radiation are dissolved during developing, namely, well-region edge spaces 2512 at the edges of the P-well regions. Again, because of the unique properties of hybrid photo resist, the spaces can be with dimensions of 0.2 µm or less using lithography tools that are designed for operation at 0.35 µm resolution.

Returning to the method 2000 illustrated in FIG. 11, the next step 216 is to form P-well edge implants though the well edge spaces. The P-well edge implants preferably comprise a P+ region around the edges of the P-well. The implants are preferably formed by implanting boron (or other acceptor species such as indium (In) or $BF_2$ through the well edge shapes. Again, the amount of implant is selected to reduce minority carrier lifetimes, but should be done at a low enough dose so as not to destroy the photoactive compound in the hybrid resist. As such, the preferred implant is boron and suitably implanted to a depth greater than the STI trench depth. The preferred dose is about 1E11 to 1E15 ions/sq-cm and the most preferred dose is about 1E13 ions/sq-cm.

Figure 17:
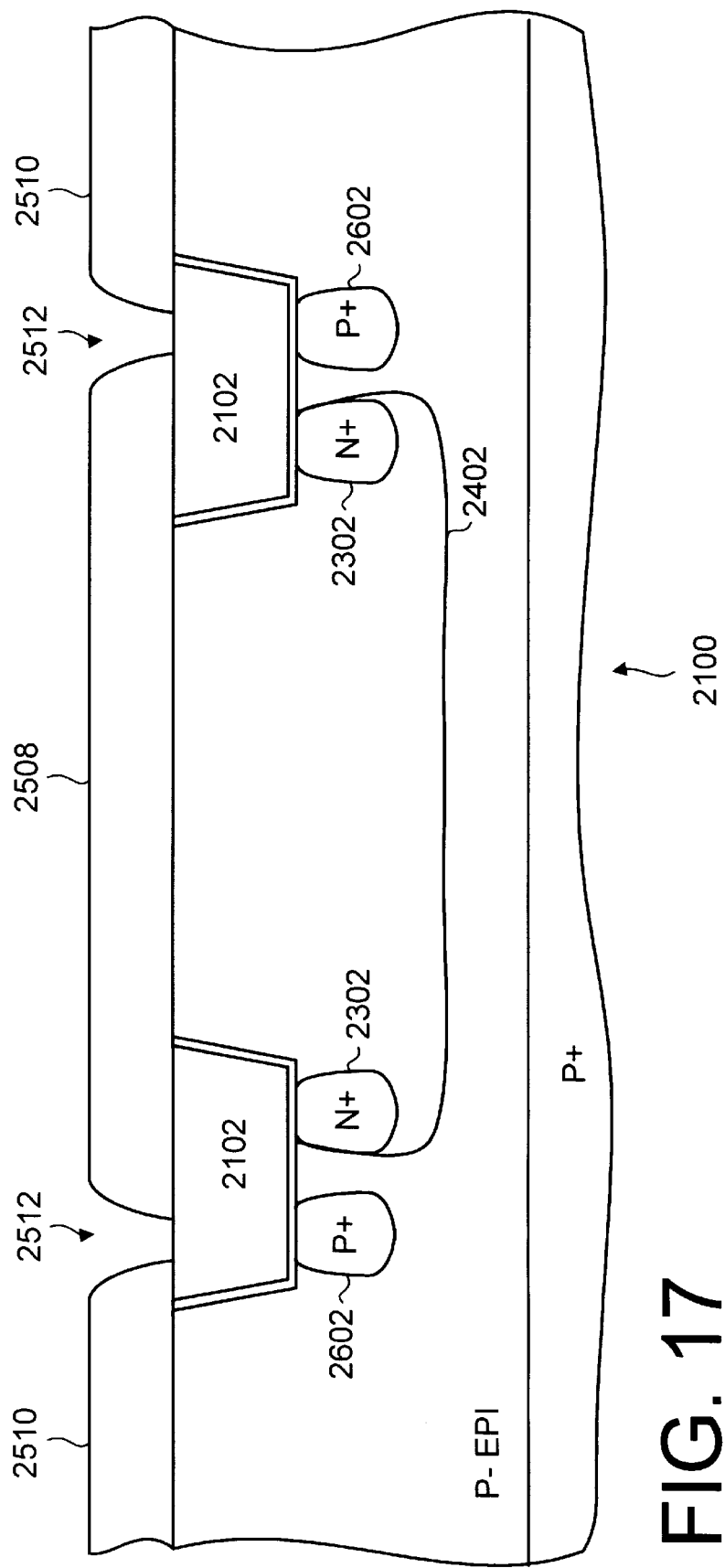
FIG. 17 is a cross-sectional side view of a wafer portion with P-well edge implants.

Turning to FIG. 17, the wafer portion 2100 is illustrated with P-well edge implants 2602 formed. Returning to the method 2000, the next step 218 would be to expose and develop the P-well regions of the hybrid resist. Because the hybrid resist portion above the P-well regions were unexposed, they comprise positive tone patterns. Thus, the hybrid resist portions above the P-well regions can be removed without requiring additional masking steps by blanket exposing the wafer portion and developing away the positive tone patterns.

Figure 18:
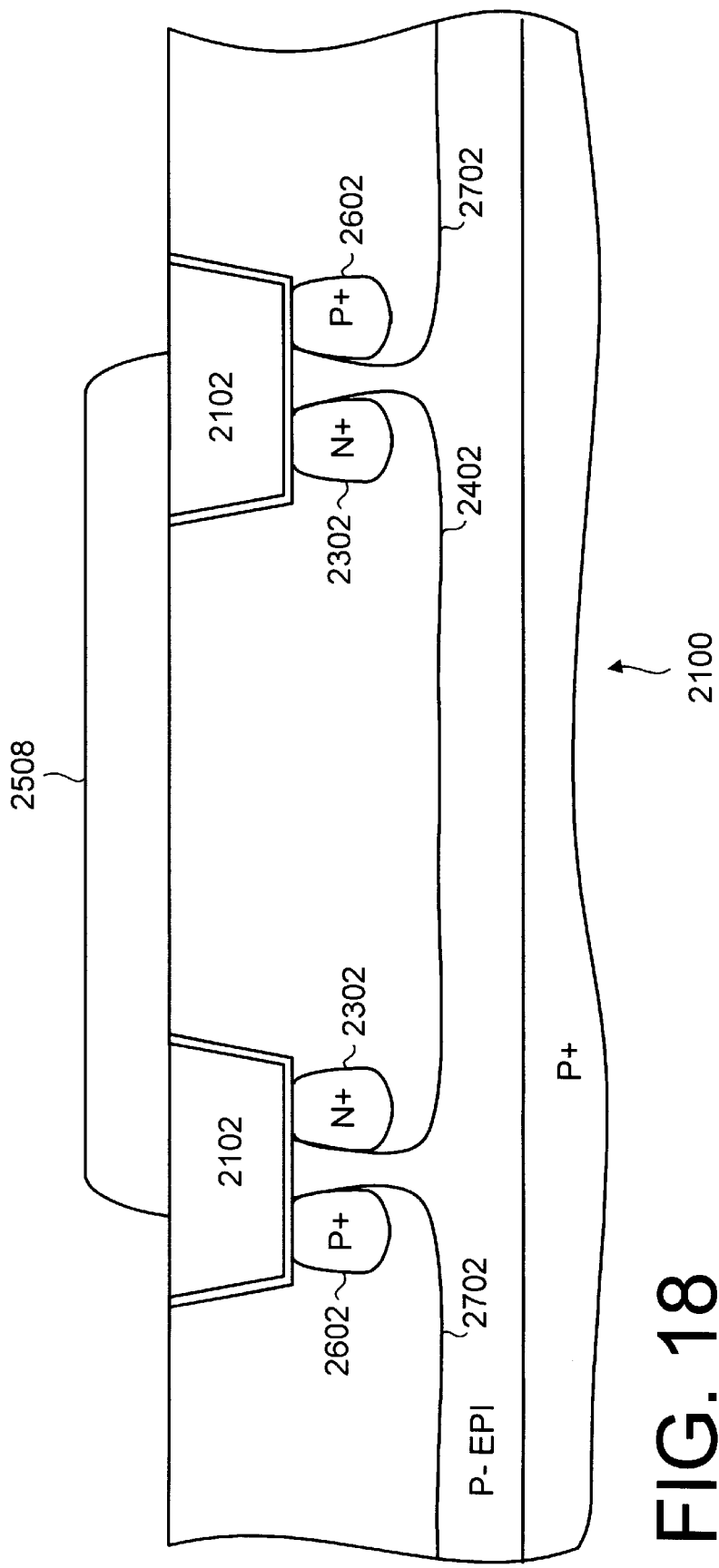
FIG. 18 is a cross-sectional side view of a wafer portion with P-well edge implants and the P-well formed.

At the next step 220, P-wells are formed using any suitable P-type implant technique. Turning to FIG. 18, the wafer portion 2100 is illustrated with the positive tone portions 2510 of the hybrid resist removed and P-wells 2702 implanted into the substrate. The remaining negative tone portion 2508 serves to mask off the non-P-well regions from receiving the P-type implant. Because the P-well edge implants 2602 share the same negative tone resist structures as the p-well 2702, they are self aligned with each other.

In the next step 222 (FIG. 10), the remaining portions (i.e., the negative tone portions 2508) of the hybrid resist are stripped.

Figure 19:
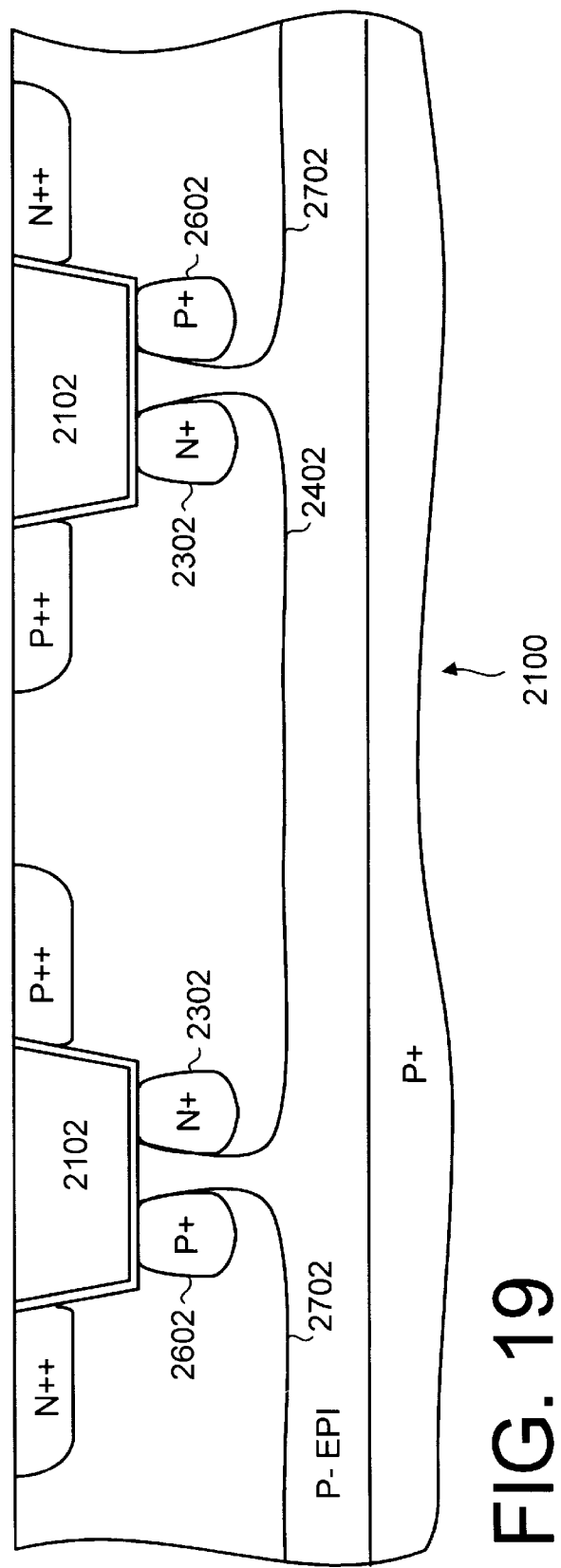
FIG. 19 is a cross-sectional side view of a wafer portion with contact diffusion regions formed.

The wafer portion 2100 can then be completed using suitable fabrication techniques, e.g., forming the device gates and the contact diffusion regions. Turning to FIG. 19, the wafer portion 2100 is illustrated with the N++ and P++ contant diffusion regions formed. These contact diffusion regions are typically formed at the silicon surface where the diffusion implants are not masked by the polysilicon gates (polysilicon gates not shown in FIG.)

Thus, the first embodiment illustrated in FIGS. 12–19 provides a method and structure for reducing latch-up in CMOS devices by forming N+ and/or P+ edge implants at the edge of the P-wells, N-wells and/or twin-wells. A second embodiment, illustrated in FIGS. 20–23, uses a similar method to reduce latch-up by using the edge implants to adjust the profile of the N-wells and/or P-wells. In this embodiment, the edge implants comprise the implant species that is the opposite doping polarity as the N-wells and/or P-wells. In the N-well regions, the edge implants comprise P-type dopants and in the P-well regions, the edge implants comprise N-type dopants.

Figure 20:
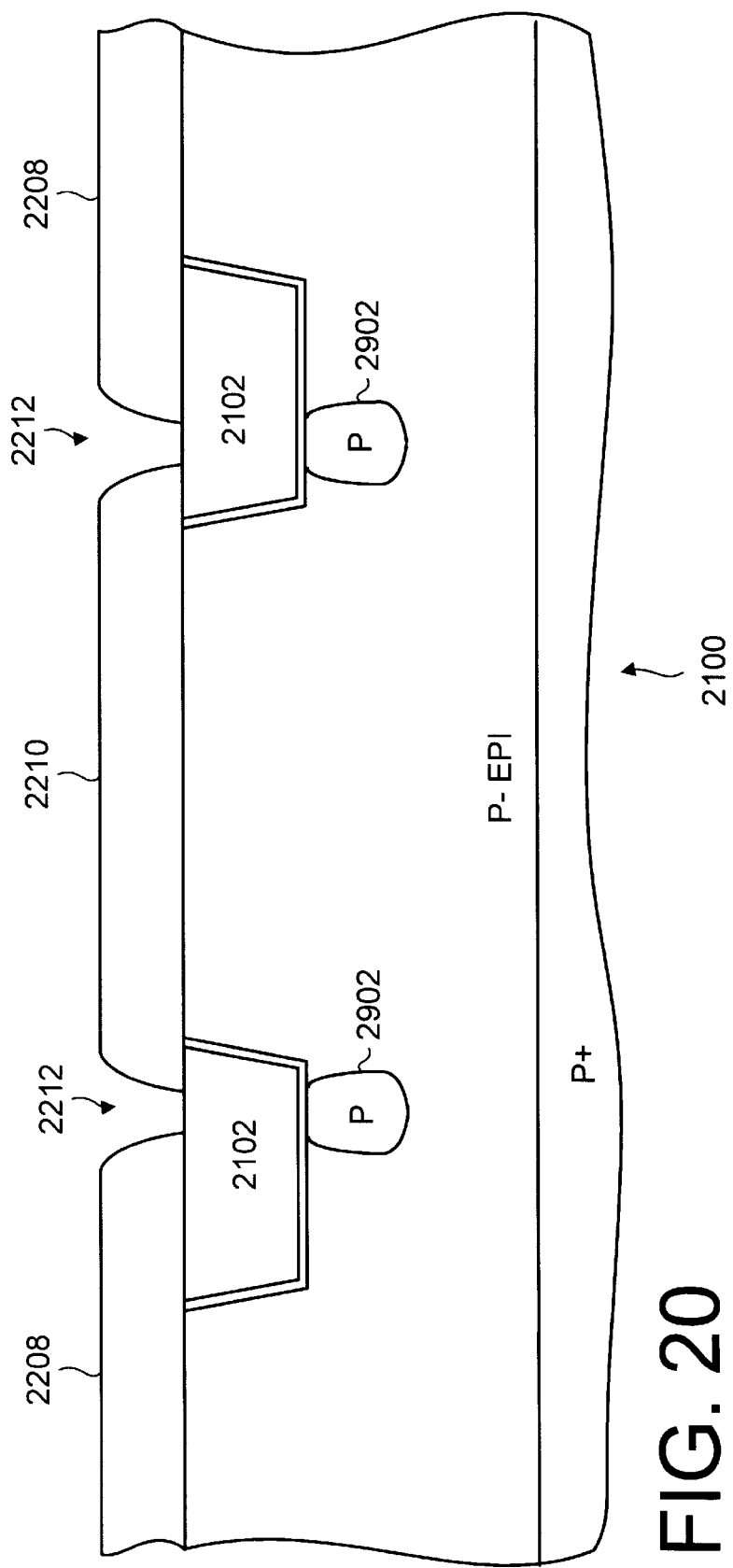
FIG. 20 is a cross-sectional side view of a wafer portion overlaid with hybrid resist for N-well edge implant formation and N-well formation in accordance with the second embodiment where the N-well edge implant comprises a P-type implant.

Turning to FIG. 20, the wafer portion 2100 is illustrated with opposite species well edge implants. This embodiment is formed in the same manner as the first until the well edge implants are implanted. In particular, hybrid resist is deposited and exposed to actinic radiation with the N-well regions blocked by chrome mask shapes. This forms well edge spaces 2212 at the edges of the N-well regions and a positive tone pattern 2210 and negative tone patterns 2208.

In this embodiment, P-type implants 2902 are formed through well edge spaces 2212. The P-type implants 2902 are selected to form a P-type region under the STI 2102 that is self aligned to the edge of the N-well. The P-type implant dose and energy should be selected to place the dopant directly under the STI with a dose sufficient to counterdope the N-well.

The next step is again to expose and develop the N-well regions of the hybrid resist. Because the hybrid resist portion above the N-well regions were unexposed, it comprises positive tone patterns. Thus, the hybrid resist portions above the N-well regions can be removed by blanket exposing the wafer portion and developing away the positive tone patterns. Thus, this removal can be done without requiring additional masking layers or masking steps.

Figure 21:
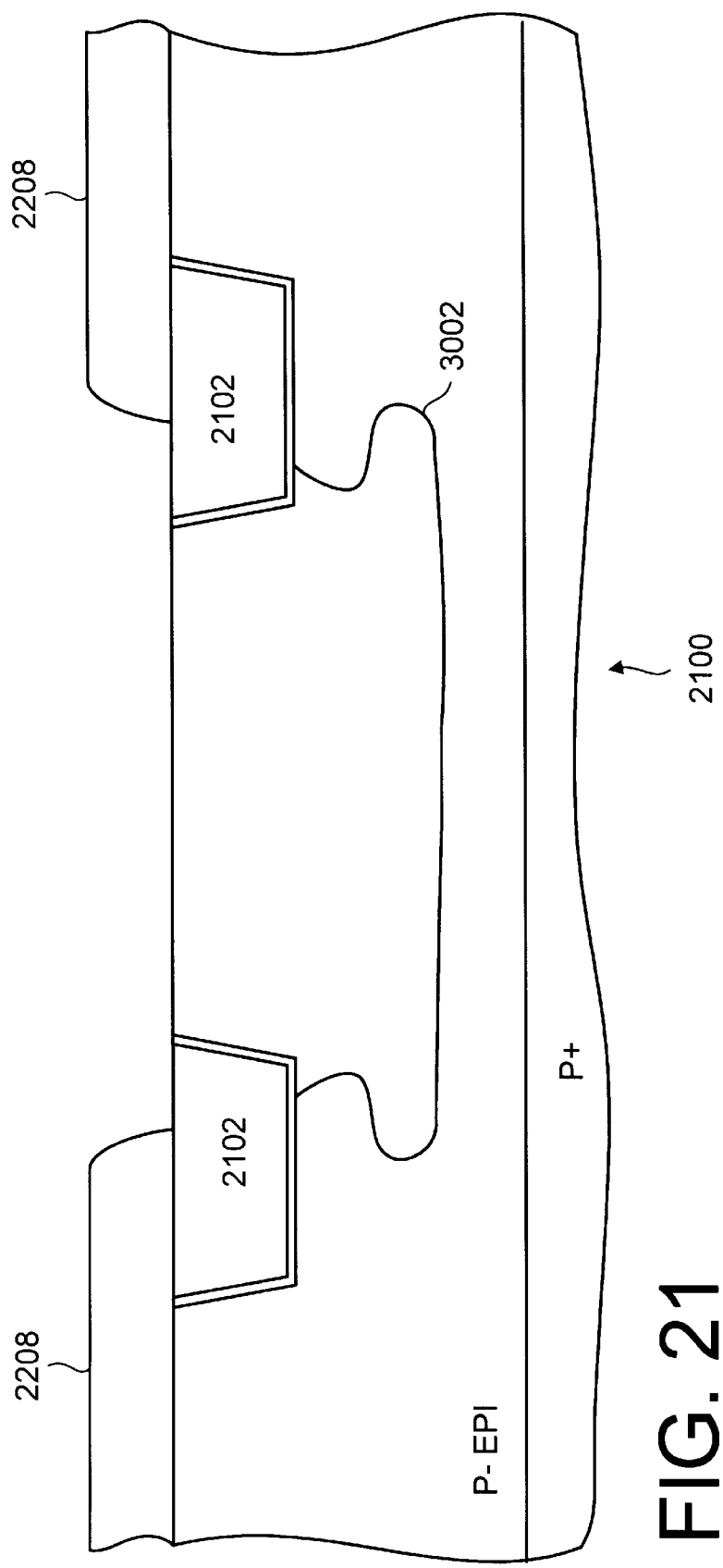
FIG. 21 is a cross-sectional side view of a wafer portion with an N-well formed in accordance with the second embodiment.

The next step is to form N-wells using any suitable N-type implant technique. Turning to FIG. 21, the wafer portion 2100 is illustrated with the positive tone portion 2210 of the hybrid resist removed and an N-type implant made to form N-well 3002. The remaining negative tone portions 2208 serve mask off the non-N-well regions from receiving the N-type implant. Where the N-type implant overlaps the P-type well edge implant, two opposite species cancel out. Thus, the profile of the resulting N-Well 3002 is as illustrated in FIG. 21. Adjusting the profile in this way reduces the base transport factor of the parasitic transistor, this reduces the minority carrier lifetimes and the propensity of the device to latch-up.

Figure 22:
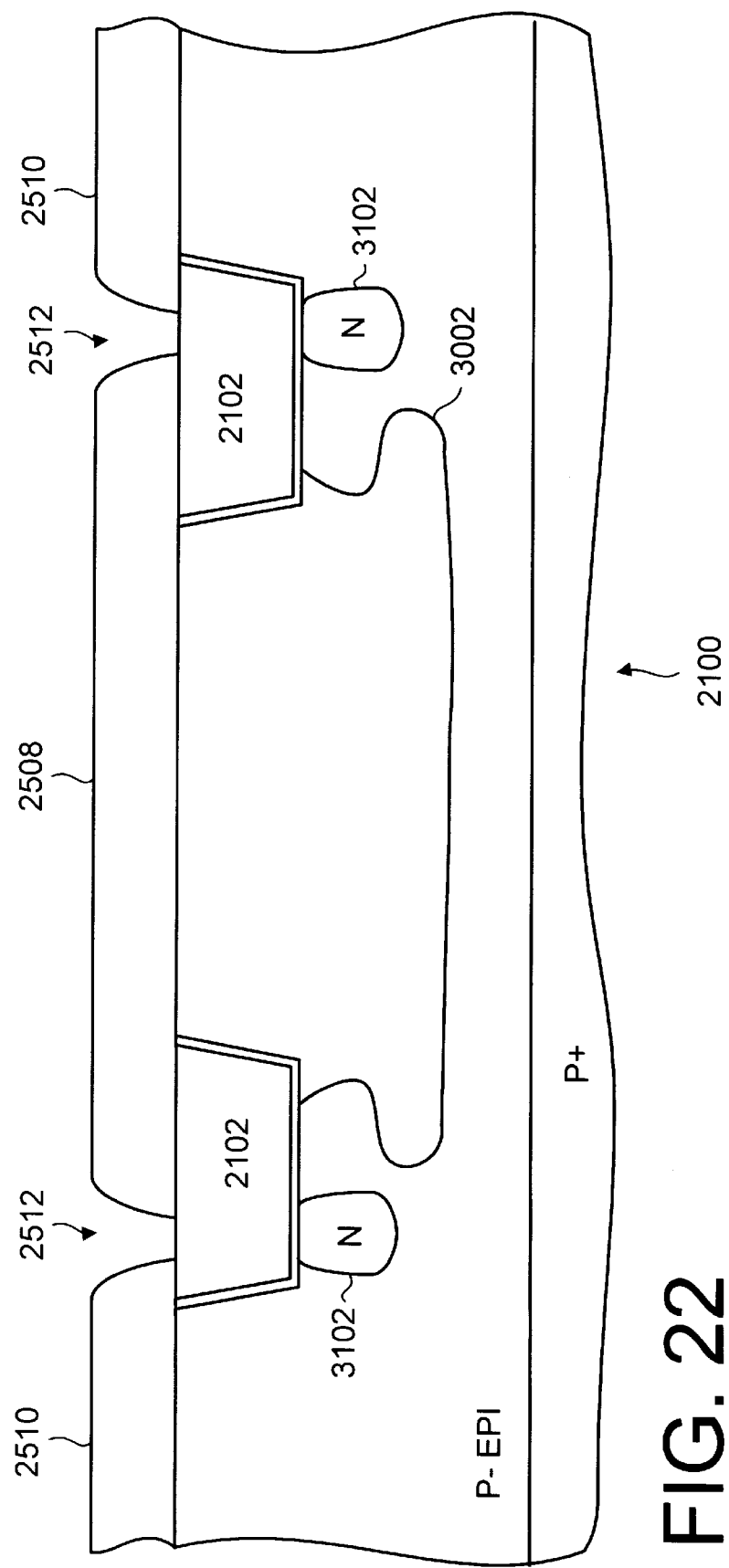
FIG. 22 is a cross-sectional side view of a wafer portion overlaid with hybrid resist for P-well edge implant formation and P-well formation in accordance with the second embodiment where the P-well edge implant comprises a N-type implant.

Turning to FIG. 22, the wafer portion 2100 is illustrated with opposite species well edge implants for the P-wells. Again, the P-well edge implants are formed in the same manner as the first embodiment using hybrid photo resist. In particular, hybrid resist is deposited and exposed to actinic radiation with the P-well regions blocked by chrome mask shapes. This forms well edge spaces 2512 at the edges of the P-well regions and a negative tone pattern 2510 and positive tone patterns 2508.

In this embodiment, N-type implants 3102 are formed through well edge spaces 2512. The N-type implants 3102 are selected to form an N-type region under the STI 2102 that is self aligned to the edge of the P-well. The N-type implant dose and energy should be selected to place the dopant directly under the STI with a dose sufficient to counterdope the P-well.

The next step is again to expose and develop the P-well regions of the hybrid resist. Because the hybrid resist portion above the P-well regions were unexposed, they comprise positive tone patterns. Thus, the hybrid resist portions above the P-well regions can be removed by blanket exposing the wafer portion and developing away the positive tone patterns. Thus, this removal can be done without requiring additional masking layers or masking steps.

Figure 23:
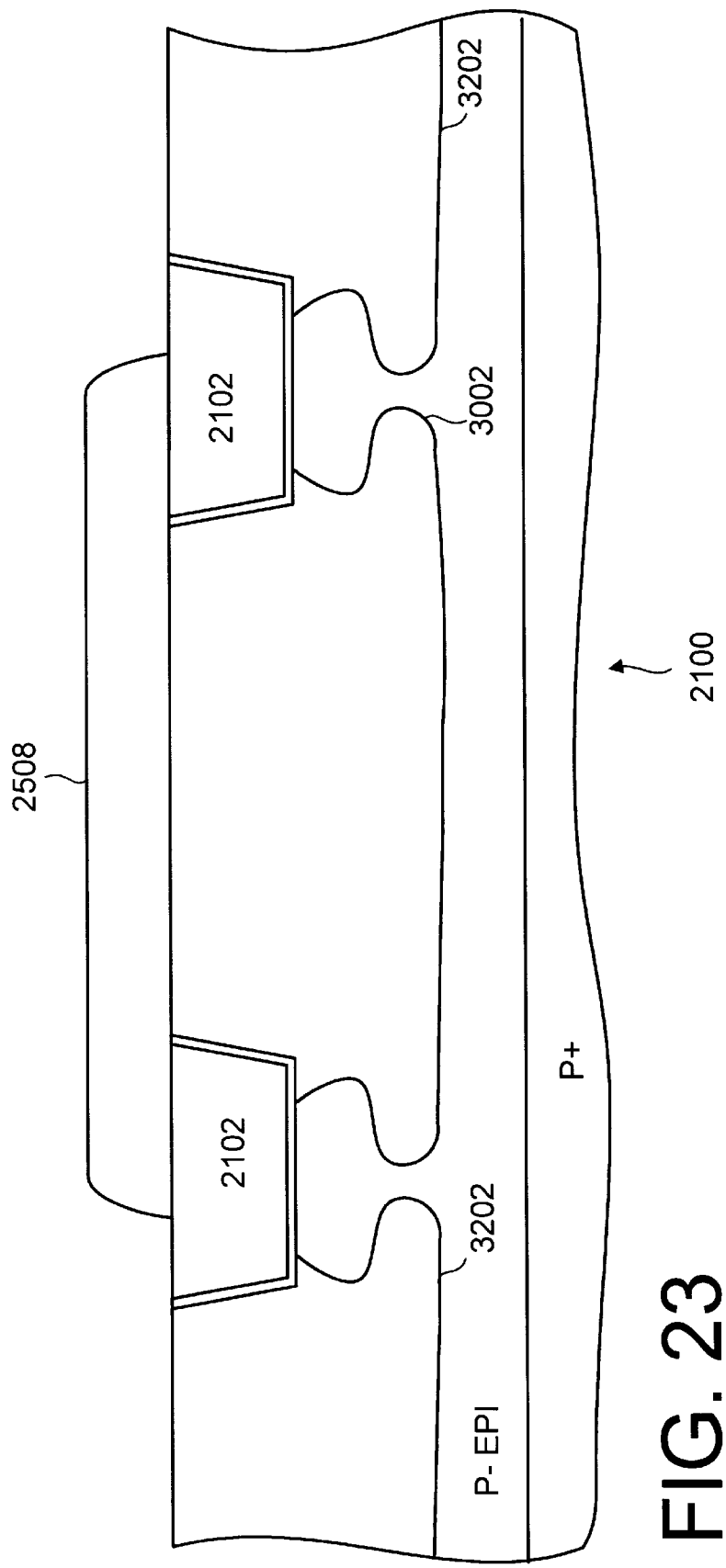
FIG. 23 is a cross-sectional side view of a wafer portion with an N-well and P-wells formed in accordance with the second embodiment.

The next step is to form P-wells using any suitable P-type implant technique. Turning to FIG. 23, the wafer portion 2100 is illustrated with the positive tone portions 2510 of the hybrid resist removed and an P-type implant made to form P-wells 3202. The remaining negative tone portion 2508 serves to mask off the non-P-well regions from receiving the P-type implant. Where the P-type implant profile overlaps the N-type well edge implant profile, the two opposite species combine to produce a net doping profile that is the difference between the N-type and P-type concentrations. Thus, the profile of the resulting P-Wells 3202 is as illustrated in FIG. 23. Adjusting the profile in this way reduces the base transport factor of the parasitic transistor. This reduces the minority carrier lifetimes and the propensity of the device to latch-up.

The use of the well edge implants to adjust well profile has several advantages. First, because the P-type well edge implant is self aligned with the N-well, the sensitivity of the NPN base width on P-well to N-well overlay is reduced which improves the control of the NPN gain. Second, because the N-type well edge implant is self aligned with the N-well, the sensitivity of the PNP base width on P-well to N-well overlay is reduced which improves the control of the PNP gain. Finally, the addition of P-type and N-type counterdoping in the region under the STI degrades carrier mobility, which acts to increase holding voltage when latch-up is triggered.

Thus, the preferred embodiments provide a method and structure for forming reducing latch-up in CMOS devices by forming edge implants at the edge of the P-wells, N-wells and/or twin-wells. These edge implants reduce the minority carrier lifetime in the parasitic lateral transistor. By using the unique properties of hybrid photoresist, the edge implants are self aligned to the wells and are formed without requiring additionally masking steps.

While the invention has been particularly shown and described with reference to a preferred exemplary embodiment using edge implants formed with hybrid resist at the edges of P-wells and N-wells, it will be understood by those skilled in the art that various changes in form and details may be made therein without departing from the spirit and scope of the invention. In particular, the use of positive tone portions of the hybrid resist defining the well areas can be exchanged for negative tone portions. It is also to be understood by those skilled in the art that the invention is applicable to different isolation technologies (e.g., LOCOS, recessed oxide (ROX), STI, etc.), well and substrate technologies, dopant types, energies and species. It will also be understood that the spirit of the invention is applicable to other silicon-based technologies (e.g., BiCMOS, bipolar, silicon on insulator (SOI), silicon germanium (SiGe).

What is claimed is:

1. A semiconductor structure:
   a) a well region formed in said semiconductor substrate; and
   b) a well edge implant, said well edge implant formed at the edge of said well region in said semiconductor substrate, wherein said well edge implant is formed under a shallow trench isolation, wherein said well edge implant comprises a P+ type implant and wherein said well region comprises a N type well region.

2. A semiconductor structure:
   a) a well region formed in said semiconductor substrate; and
   b) a well edge implant, said well edge implant formed at the edge of said well region in said semiconductor substrate, wherein said well edge implant is formed under a shallow trench isolation, wherein said well edge implant comprises a N+ type implant and wherein said well region comprises a P type well region.

3. A semiconductor structure comprising:
   a) a semiconductor substrate;
   b) a well formed in said semiconductor substrate, said well having an exterior perimeter and a substantially planer bottom;
   c) a self-aligned well edge implant formed at said exterior perimeter of said well, said self-aligned well edge implant being self aligned with said exterior perimeter of said well, wherein said self-aligned well edge implant comprises a P+ type implant and wherein said well comprises a N type well; and
   d) a shallow trench isolation region, and wherein said self-aligned well edge region is formed under said shallow trench isolation.

4. A semiconductor structure comprising:
   a) a semiconductor substrate;
   b) a well formed in said semiconductor substrate, said well having an exterior perimeter and a substantially planer bottom;
   c) a self-aligned well edge implant formed at said exterior perimeter of said well, said self-aligned well edge implant being self aligned with said exterior perimeter of said well, wherein said self-aligned well edge implant comprises a N+ type implant and wherein said well comprises a P type well; and
   d) a shallow trench isolation region, and wherein said self-aligned well edge region is formed under said shallow trench isolation.

5. The semiconductor structure of claim 3 wherein said self-aligned well edge implant comprises a loop of implant region.

6. The semiconductor structure of claim 3 wherein said self-aligned well edge implant is formed inside said well with an edge of said self-aligned well edge implant aligned with the exterior perimeter of said well.

7. The semiconductor structure of claim 4 wherein said self-aligned well edge implant comprises a loop of implant region.

8. The semiconductor structure of claim 4 wherein said self-aligned well edge implant is formed inside said well with an edge of said self-aligned well edge implant aligned with the exterior perimeter of said well.

* * * * *